United States Patent [19]
Ouellet

[11] Patent Number: 5,747,361
[45] Date of Patent: May 5, 1998

[54] STABILIZATION OF THE INTERFACE BETWEEN ALUMINUM AND TITANIUM NITRIDE

[75] Inventor: Luc Ouellet, Granby, Canada

[73] Assignee: Mitel Corporation, Kanata, Canada

[21] Appl. No.: 543,497

[22] Filed: Oct. 16, 1995

Related U.S. Application Data

[63] Continuation of Ser. No. 140,080, Jun. 15, 1994, abandoned.

[30] Foreign Application Priority Data

May 1, 1991 [CA] Canada ................................ 2041730

[51] Int. Cl.$^6$ ................................................. H01L 21/28
[52] U.S. Cl. ........................ 437/190; 437/192; 437/194; 437/197
[58] Field of Search ................................. 257/764, 765, 257/771, 915, 767; 437/192, 194, 197, 190, 246

[56] References Cited

U.S. PATENT DOCUMENTS 4,820,611  4/1989  Arnold, III et al. ............... 430/318

FOREIGN PATENT DOCUMENTS

| 0276087 | 7/1988 | European Pat. Off. | ............... 257/915 |
| 58-046641 | 3/1983 | Japan | ............... 437/246 |
| 58-139426 | 8/1983 | Japan | ............... 437/194 |
| 0009971 | 1/1988 | Japan | ............... 257/771 |
| 0129662 | 6/1988 | Japan | ............... 257/915 |

*Primary Examiner*—John Niebling
*Assistant Examiner*—Thomas G. Bilodeau
*Attorney, Agent, or Firm*—Marks & Clerk

[57] ABSTRACT

A semiconductor device comprises at least one metal interconnect layer, a titanium-based barrier layer in contact with the metal interconnect layer. The metal interconnect layer contains titanium in an amount up to the limit of solid solubility at the peritectic temperature. The arrangement is effective to reduce hillock, spike, and notch formation in the semiconductor device.

12 Claims, 16 Drawing Sheets

SIMBAD SIMULATION OF GRAIN
STRUCTURE AND ORIENTATION

SIMBAD SIMULATION OF LOCAL DENSITY

STABILIZATION OF THE INTERFACE BETWEEN ALUMINUM AND TITANIUM NITRIDE

This application is a continuation of application Ser. No. 08/140,080 filed Jun. 15, 1994, now abandoned.

This invention relates generally to the fabrication of semiconductor devices, and more particularly to semiconductor devices, such as integrated circuits, having a barrier layer for the suppression of spikes, hillocks or notches.

In the fabrication of semi-conductor devices, a first layer of electrical isolation film having a low coefficient of thermal expansion can be deposited over previously deposited and/or patterned polysilicon, polycide or refractory metal transistor gates, sources and drains, or previously deposited and patterned capacitor electrodes.

Contact holes are then plasma etched through the insulating layer. In the next step, a first level of high coefficient of thermal expansion interconnect material is deposited so as to electrically contact the underlying components. This level of interconnect material is plasma etched, typically in various chlorine and fluorine containing discharges, using standard photolithography techniques to form interconnect tracks.

Subsequently, a second layer of low coefficient of thermal expansion electrical isolation film is deposited over the patterned interconnect material to ensure its electrical isolation. This dielectric is typically deposited at temperatures ranging from 350° to 500° C. Unfortunately, the exposure to such temperatures can cause spikes to form in monosilicon substrate and polysilicon tracks, and hillocks to grow on the interconnect material. Spikes are dendritic extensions of the interconnect layer into the underlying layer, whereas hillocks are similar extensions projecting upwardly into the overlying layer. Hillock and spike formation will be described in more detail later.

It has been proposed, see for example U.S. Pat. No. 4,782,380, to suppress hillock formation by depositing a layer of titanium/tungsten alloy over the interconnect layer. While this has proved partly successful at overcoming hillock formation, unfortunately plasma etching of the aluminum alloy cannot be used in fluorine based plasma chemistries because aluminum trifluoride has an extremely high melting point of 1040° C., and a boiling point as high as 1537° C.

Since tungsten hexachloride, $WCl_6$, has a high melting point of 275° C., and a very high boiling point of 346.7° C., and since tungsten texafluoride, $WF_6$ has a much lower melting point of 2.5° C. and a boiling point of only 17.5° C., Ti:W films, which typically contain 10.0 wt. % Ti and 90 wt. % W, are slowly etched in chlorine based plasma chemistries without extensive ion bombardment that are necessary for tungsten chloride sputtering. Etching Ti:W films in $CF_4$, $C_2F_4$, $SF_6$, $NF_3$ or any other fluorine containing discharges is much easier and does not require extensive sputtering. Plasma etching of TiW/Al structures may require the use of chlorine and fluorine plasmas if ion bombardment is not available to induce sputtering of tungsten chlorides.

If the top Ti:W layer is not completely etched away in areas where the interconnect material must be removed, and if extensive ion bombardment is not available to sputter tungsten chlorides, the residues of Ti:W (located over the aluminum alloy to be etched) act as local micro-masks during chlorine-based aluminum alloy etching and cause the formation of local stalagmites and stringers, which cause yield as well as reliability problems.

Ti:W is obtained by powder metallurgy. Sputtered films are composed of a single body centered cubic β-phase with W and Ti rich areas, which are free to react with the underlying aluminum alloy. At a temperature of about 425° C., aluminum slowly diffuses into the tungsten and forms, at the grain boundaries, an aluminum rich intermetallic phase, $WAl_{12}$. At slightly higher temperatures, a tungsten richer intermetallic phase also precipitates $WAl_5$.

At a temperature of about 350° C., titanium diffuses into the aluminum alloys and forms, at the grain boundaries, another aluminum rich intermetallic phase, $TiAl_3$.

Since the manufacture of semiconductor devices may require the (aluminum alloy)-Ti:W interface to be exposed to temperatures exceeding 425° C., the latter becomes metallurgically unstable and may be undesirable.

Reactive sputtering Ti:W in a mixture of argon and nitrogen can improve the interface stability by stuffing the Ti and W grain boundaries with nitrogen, but this technique results in the formation of a very complex solid solution of titanium, Ti, tungsten, W, titanium nitride, TiN, and tungsten nitride, $WN_2$.

The obtained Ti:W targets are generally of poor quality; are very porous, at 75 to 98% of the theoretical density; have large crystallites that cause particle problems on metallized wafers; and their mobile ion concentrations are very high and may be incompatible with some high quality CMOS device requirements. Sometimes, their Ti/W ratios vary throughout their bulk which cause reproducibility problems. They are very expensive to manufacture and the cost is prohibitive in some applications.

Ti:W sputtering itself is very difficult to achieve because exposure of the Ti:W target to air causes its spontaneous oxidation and creates major particle problems on the metallized wafer. Accumulation of Ti:W on chamber walls is problematical and results in flaking and particle contamination.

Intrinsic stress of the sputtered film is generally very high, dependant on the history of the target, its oxidation state, and target Ti/W ratios, which vary during sputtering. Increasing sputtering pressure can nevertheless reduce this stress to lower values, but the reason for such behaviour is not yet understood and may be due to undesirable argon entrapment. Ti:W reactive sputtering in nitrogen is more difficult and gives a very complex solid solution of Ti, TiN, W and $WN_2$.

The use of a Ti:W barrier layer is therefore generally unsatisfactory.

It has also been proposed to use a titanium nitride barrier layer. However, the problem with titanium nitride is that titanium is extremely easy to oxidize, and reactive sputtering of TiN from a titanium target in argon-nitrogen gas mixture requires perfect control of residual oxygen and water vapour, although this oxidation can be prevented by reducing the base pressure of the sputtering equipment, by using extremely pure nitrogen and argon, by ensuring complete desorption of the oxygen atom containing gases trapped in the wafer prior to its metallization with TiN, by selecting very low residual oxygen titanium targets, and by imposing a small negative bias of the order of −100 to −150 volts to the wafer.

The sputtered oxygen free TiN has a complex crystalline structure that correlates to its composite stoichimetry and temperature. For temperatures lower than about 500° C., it has three crystal structures characterized by various X-ray diffraction planes:

1) (012), (110) and (011) oriented hexagonal titanium, α-Ti.

2) (111), (200) and (210) oriented tetragonal titanium nitride, ε-$Ti_2N$.

3) (111), (200) and (220) oriented face centered cubic titanium nitride, δ-TiN.

Nitrogen does not react with titanium until a threshold concentration of about 12.0 at. % N is obtained, under which the solid consists of hexagonal titanium, α-Ti, and nitrogen atoms that occupy titanium's interstitial octahedral sites, thus causing an increase of the lattice spacing. The ratio of the three crystal orientations of titanium depending upon sputtering conditions.

At about 12.0, 21.0, and 33.0 at. % N. interstitial nitrogen sequentially begins to consume (012), (110), and (011) hexagonal titanium, forming (111), (200) and (210) tetragonal titanium nitride, ε-Ti$_2$N, respectively; the lattice spacing decreasing with an increase of nitrogen.

At 33.0 at. % N, the solid solution is free from non-reacted titanium and any further increase in nitrogen content allows its simultaneous reaction in all directions with the titanium rich tetragonal titanium nitride ε-phase, forming more compact (200), (111), and (220) face centered cubic δ-phase titanium nitride, δ-TiN.

The ε-Ti$_2$N, is totally consumed at more than about 38.0 at. % N and the δ-phase face centered cubic titanium nitride, under the β-1 CaCl crystal structure, is the only phase present. Titanium and nitrogen form two face-centered cubic, FCC, sublattices.

Increasing the nitrogen content results in a decrease of vacancies in the N sublattice and in an increase of the (111)/(200) and (220)/(200) X-ray diffraction normalized intensities of the single δ-phase face centered cubic TiN up to maximum values of about 0.75 and −0.53 respectively as nitrogen reaches slightly less than 50.0 at. %. The (111), (220) and (200) inter-planar spacings also peak to a maximum of this optimum.

The obtained optimum single δ-phase TiN is highly dense, almost completely reacted, quasi-stoichiometric with almost no vacancies in the N sublattice, has a maximum density, a maximum hardness, and a minimum electrical bulk resistivity.

The minimum reported bulk resistivity is 18.0 μΩ.cm for stoichiometric and monocrystalline (111) face centered cubic δ-phase TiN, very close to the reported phonon contribution to resistivity in TiN, which is 14.0 μΩ.cm.

Bulk resistivity of pure and polycrystalline single face centered cubic δ-phase TiN is also minimum when quasi-stoichiometric and is about 25.0 μΩ.cm at 49.5 at. % N. The nitrogen sublattice has quite a substantial number of vacancies that cause titanium to be poorly bonded to TiN, at the grain boundaries for example. TiN crystal structure can be made (200) by applying a negative bias to the wafer.

Since this single face centered cubic δ-phase TiN exists at up to 66.6 at. % N, resulting in an increase of TiN bulk resistivity due to a decrease in grain size and an increase in dislocation density, the excess nitrogen must be interstitial in the TiN face centered cubic δ-phase.

Since titanium tetrachloride, TiCl$_4$, has a very low melting point of −30° C. and a low boiling point of 136° C., plasma etching of TiN in chlorine base plasmas is possible and dry etching of TiN/Al structures is much easier than dry etching of Ti:W/Al structures, which require multiple steps and recipes. Since TiN and aluminum alloys etch in the same chlorine plasmas, there is no micro-masking effects of TiN drying aluminum alloy etching and no formation of local stalagmites and stringers of this aluminum alloy.

TiN is reactively sputtered from pure Ti targets, which can be made extremely pure with virtually no porosity, can have very fine grains that prevent particles problems on the metallized wafer, can be very low in mobile ions and then compatible with high quality CMOS devices requirements, do not suffer from target composition fluctuations or sputtering reproducibility problems, and are less expensive than Ti:W targets.

The use of TiN, however, as a barrier layer for supressing hillocks, spikes, and notches is not practical as the titanium nitride—aluminum alloy interface is unstable at high temperatures.

This interface activity results from two reaction mechanisms:

4 Al+δ-TiN=δ-AlN+TiAl$_3$ (T≧550°–600° C.)

Ti+3 Al=TiAl$_3$ (T≧325° C.)

The first, high temperature reaction with single phase face centered cubic TiN, δ-TiN, is only possible at temperatures greater than than 550° C. because of a very low coefficient of diffusion of aluminum in δ-TiN at lower temperatures and because the reaction's Gibbs free energy becomes negative only at such high temperatures.

The high temperature reaction describes the penetration and chemical attack of face centered cubic titanium nitride by aluminum, which results in the replacement of titanium atoms from the face centered cubic titanium sublattice by aluminum atoms (local formation of aluminum-nitrogen, AlN, bonds), the formation of a smaller face centered cubic (Ti, Al) N cell, the expulsion of the titanium from TiN, and its precipitation in the aluminum alloy, under an intermetallic phase, AlTi$_3$. Such a reaction may occur at much lower temperatures if the TiN tetragonal phase ε-TiN, is also present. In that case, reaction temperatures occur as low as 450° C.

The second, low temperature, reaction with TiN is possible at temperatures greater than 325° C. and relates to the penetration and dissolution of titanium in aluminum alloys at high temperature and precipitation of an aluminum rich intermetallic phase, TiAl$_3$, at aluminum alloy grain boundaries upon cooling.

Because of the interface activity of TiN at higher temperatures, the use of a TiN barrier layer has not proved practical in the fabrication of modern semiconductor devices, where post-treatment temperatures greater than 350° C. are required.

An object of the present invention is to alleviate the aforementioned disadvantages.

In accordance with the present invention there is provided a semiconductor device comprising at least one metal interconnect layer, a metal compound based barrier layer in contact with said metal interconnect layer, and said metal interconnect layer containing said metal of said compound in an amount up to the limit of solid solubility at the peritectic temperature.

Preferably, said metal compound is titanium nitride.

By employing an interconnect layer containing a solution of the metal, such as titanium, in the interconnect layer, the destruction of the barrier layer by reaction of the metal with the interconnect layer is inhibited.

In a preferred embodiment, the barrier layer is stoichimetric or non-stoichimetric δ TiN and the interconnect layer is an aluminum alloy. However, gold, tungsten, copper, and other suitable metals can be used, and the barrier layer can also be tetragonal Ti$_2$N or a mixture of single phase stoichimetric or non-stoichimetric δ TiN and silicon—Ti$_2$N.

The invention also provides a method of manufacturing a semiconductor device, comprising the steps of providing a metal interconnect layer containing a further metal in an amount up to the limit of solid solubility at the peritectic temperature, and providing in contact with said metal interconnect layer a barrier layer consisting of a compound of said further metal.

The semiconductor device can be a multilevel integrated circuit, but the invention is also applicable to single level devices.

The invention will now be described in more detail, by way of example only, with reference to the accompanying drawings, in which.

Figure 9:
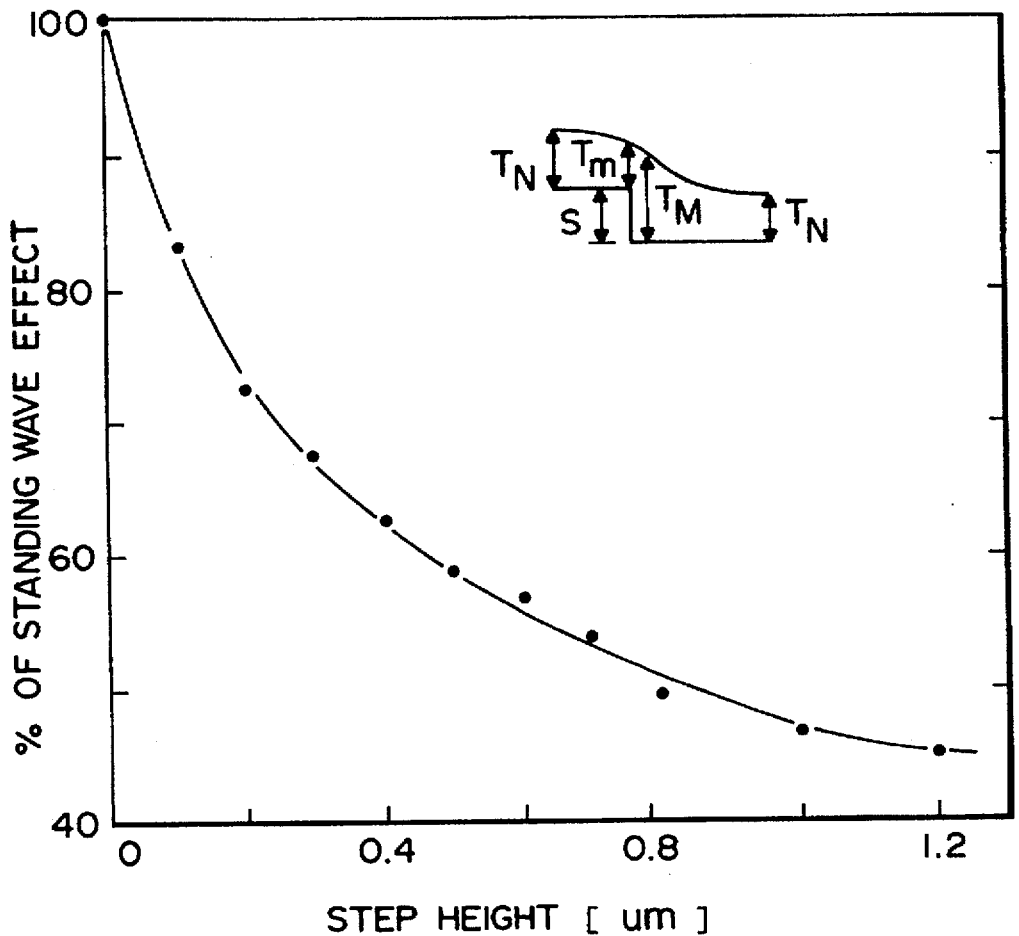
Figure 10A:
Figure 10B:
Figure 10B:
Figure 11:
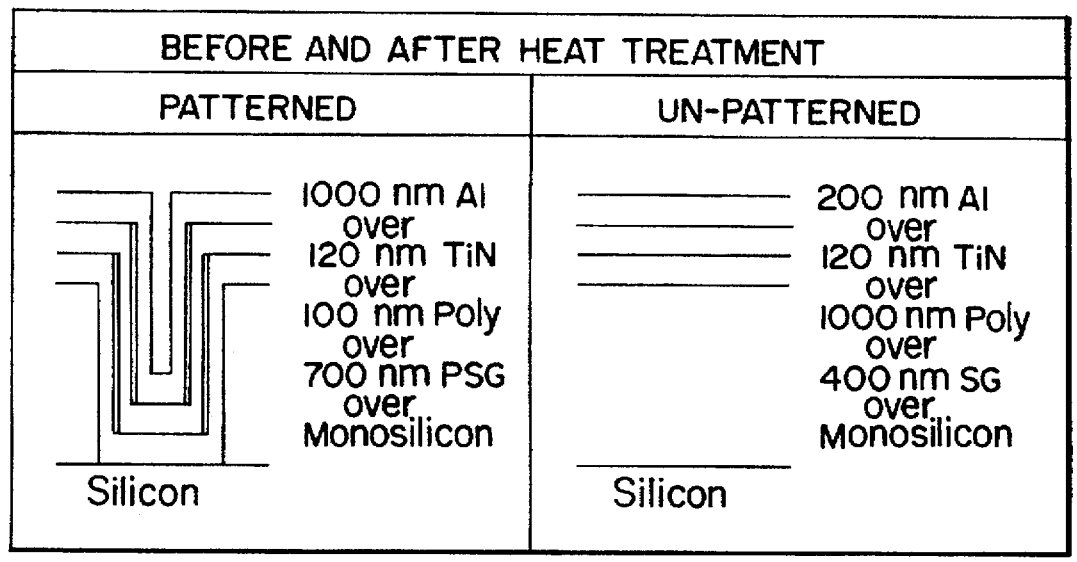
Figure 12:
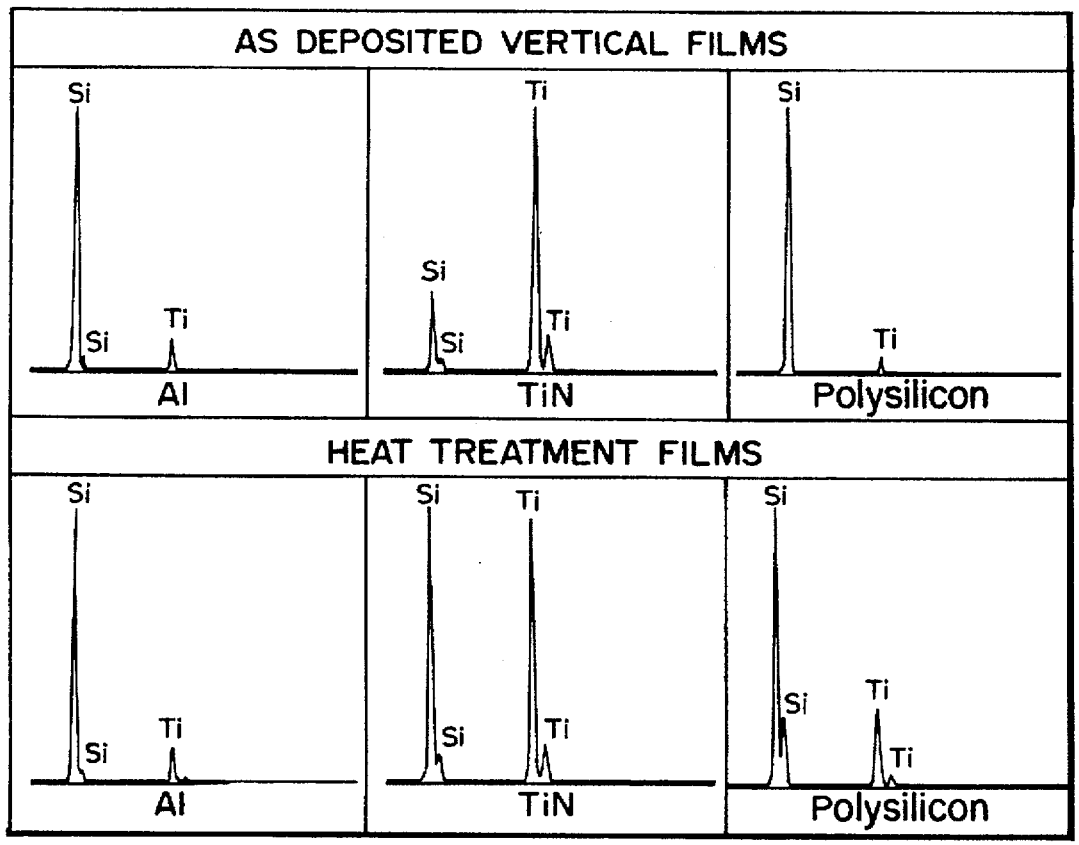
Figure 13:
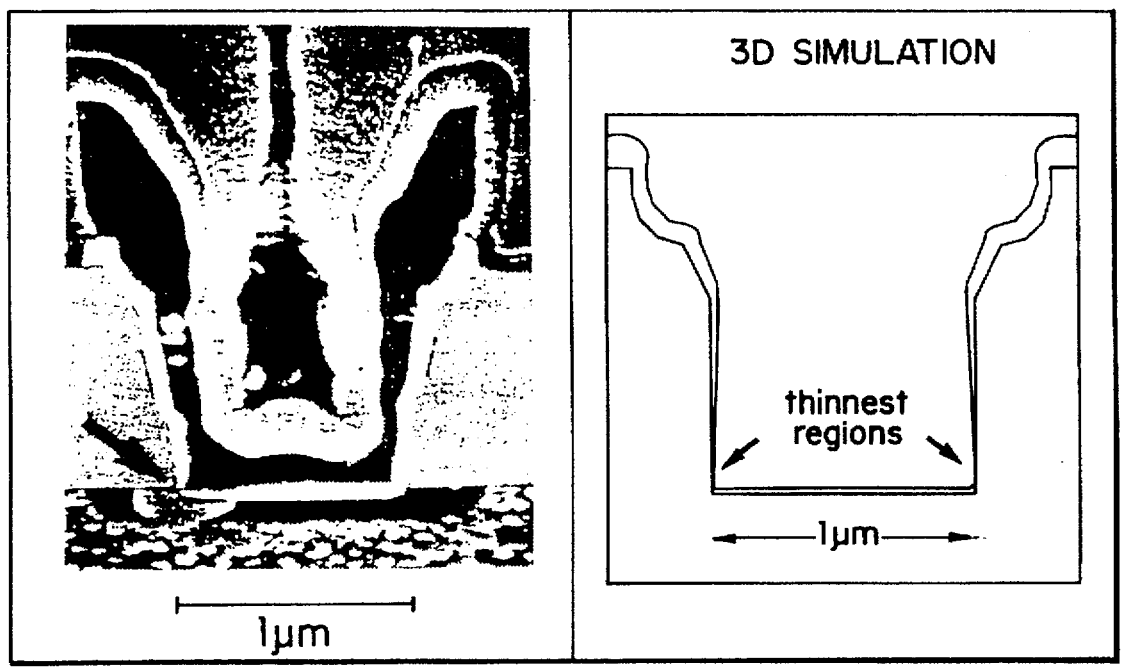
Figure 14A:
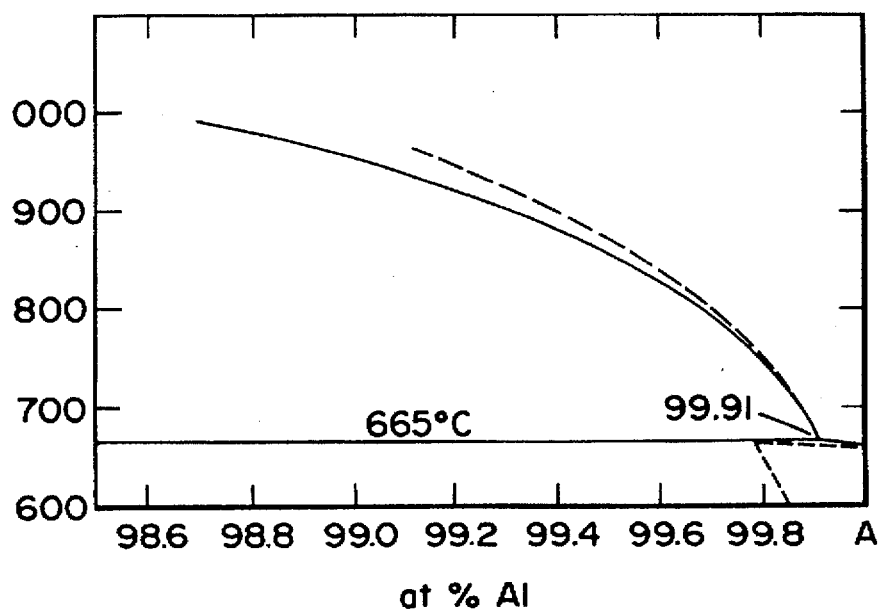
Figure 14B:
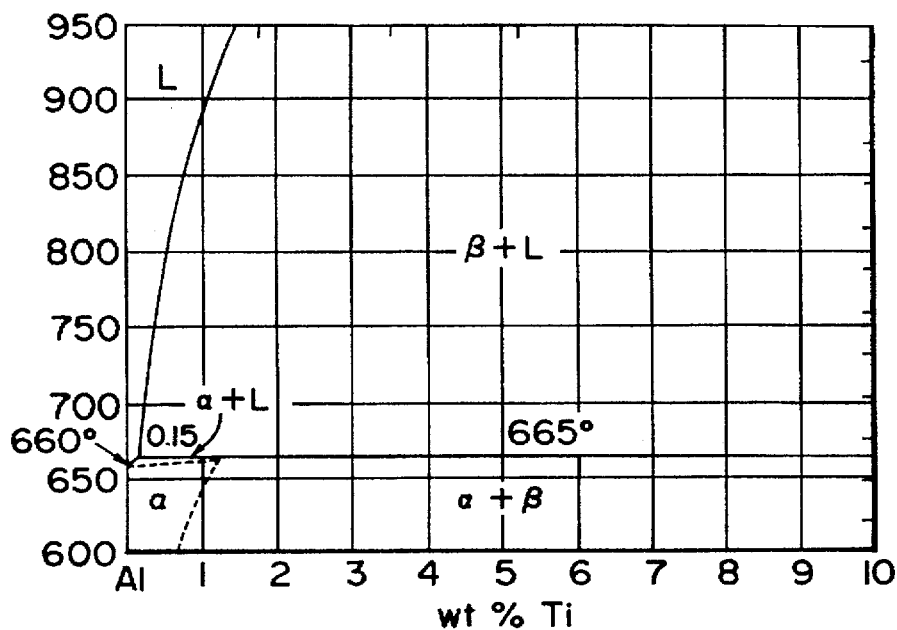
Figure 14C:
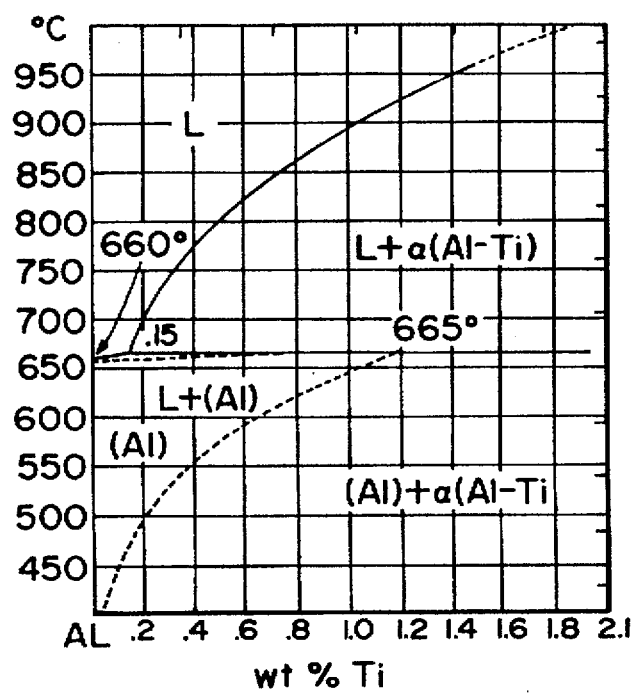
Figure 14D:
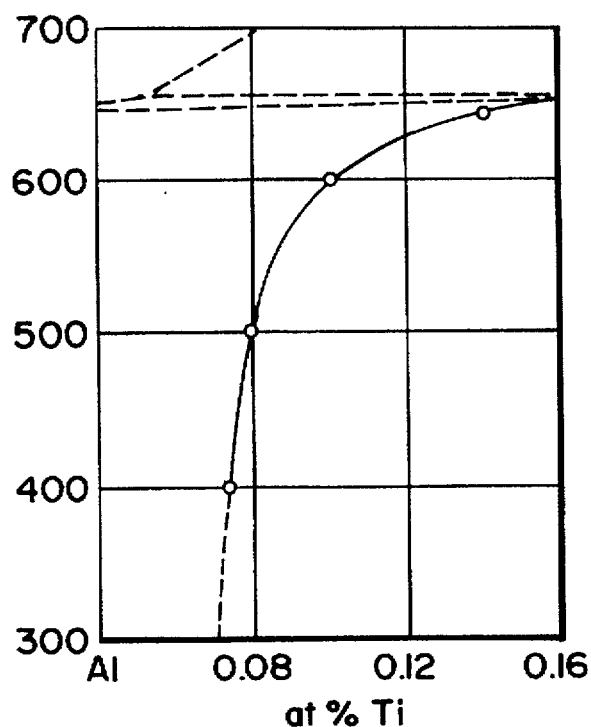
Figure 14E:
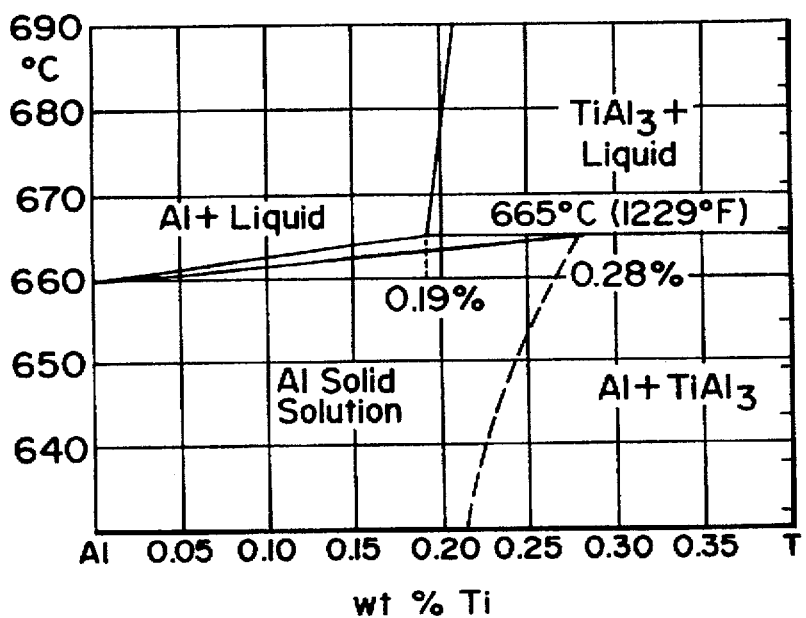
Figure 14F:
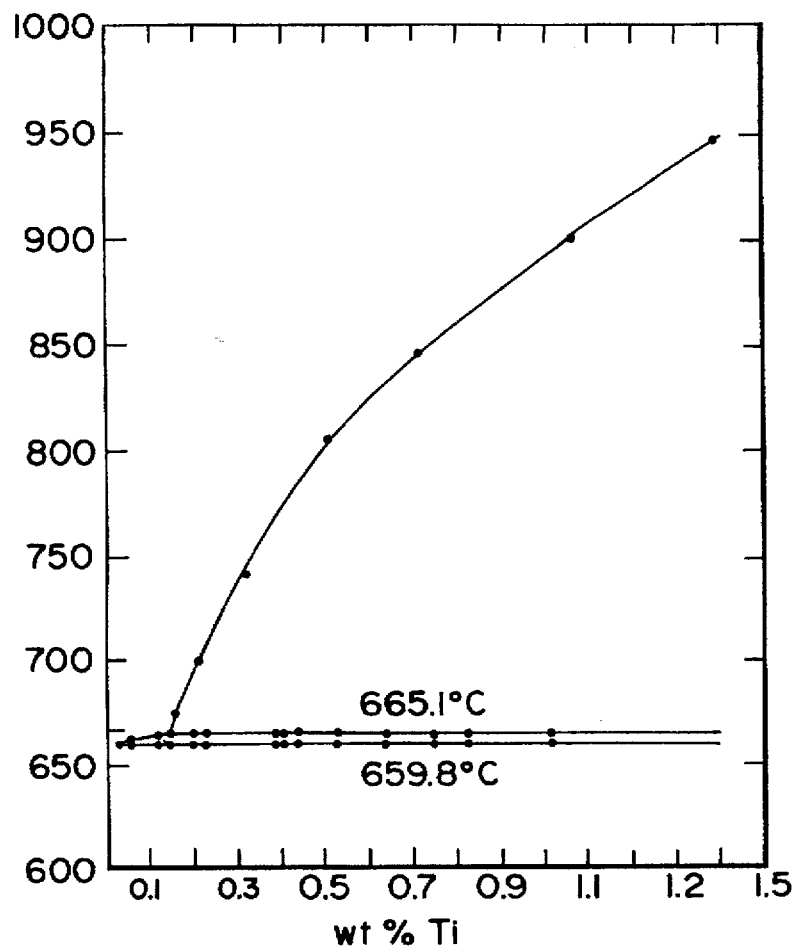
Figure 14G:
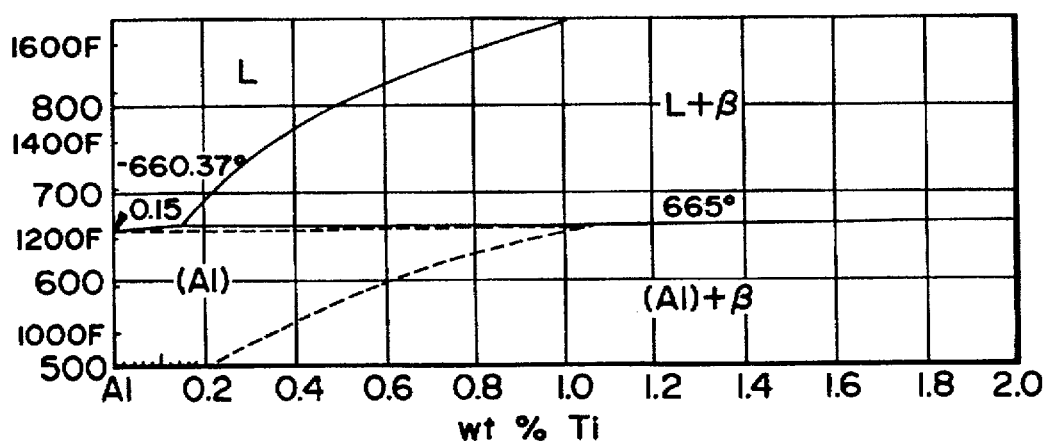

FIG. 9 summarizes the percentage contribution of the standing wave effect of a total exposure difference versus step height for 1.5 µm monolithic photoresist layer;

FIGS. 10a and 10b show a SINBAD simulation of grain orientation versus position dependency of a gamma 10 microstructure;

FIG. 11 illustrates diagrammatically TiN/aluminum alloy test structures;

FIG. 12 shows the results of task carried out on the test structures shown in FIG. 11;

FIG. 13 shows a simulation of a sputtered titanium nitride over a 1 µm diameter contact hole;

FIGS. 14a to 14g are various aluminum titanium phase diagrams.

Figure 4:
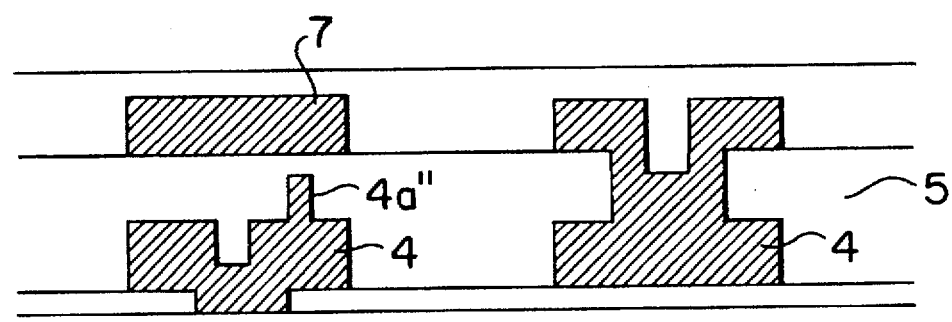
FIG. 4 shows a semiconductor device with a less serious hillock defect.
Figure 15:
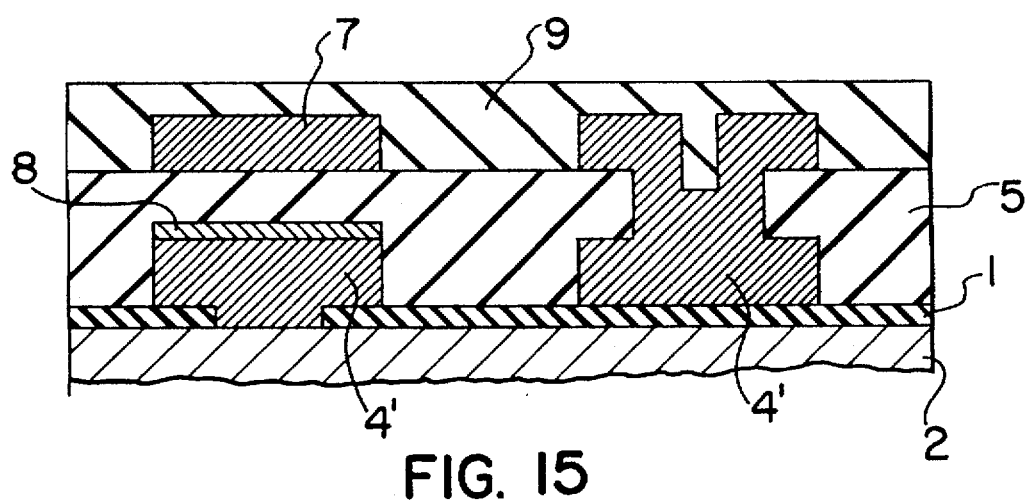

FIG. 15 shows a device similar to FIG. 4, but with a TiN barrier layer on an aluminum alloy interconnect layer in accordance with the invention.

Referring now to FIGS. 1a to 1i, the fabrication of a semiconductor device with an interconnect layer will now be described.

First, a layer 1 (FIG. 1a) of low coefficient of thermal expansion electrical isolation film is deposited over previously deposited and/or patterned polysilicon, polycide or refractory metal transistor gates, sources, and drains, or over previously deposited and patterned capacitor electrodes 2.

Contact holes 3 (FIG. 1b) are then plasma etched in the insulating dielectric 1 to reach the transistor gates, sources and drains, capacitor electrodes and any other electrodes 2 that need to be connected to other devices. A first level of high coefficient of thermal expansion interconnect material 4 (FIG. 1c) is deposited so as to electrically contact transistor gates, sources and drains or capacitor electrodes.

This first level of interconnect material 4 is plasma etched, typically in various chlorine and fluorine containing discharges, using standard photolithography techniques to form interconnect tracks 4'.

A second layer of low coefficient of thermal expansion electrical isolation film 5 (FIG. 1f) is deposited over the patterned interconnect material to ensure its electrical isolation. This dielectric is typically deposited at temperatures ranging from 350° to 500° C. The exposure to such temperatures may cause spikes 4a, for reasons to be discussed in more detail below, to form in the monosilicon substrate and in polysilicon tracks, and hillocks 4b to grow on the interconnect material. Via holes 6 are then plasma etched in that insulating dielectric to reach the tracks of the first level of interconnect material.

Figure 1G:
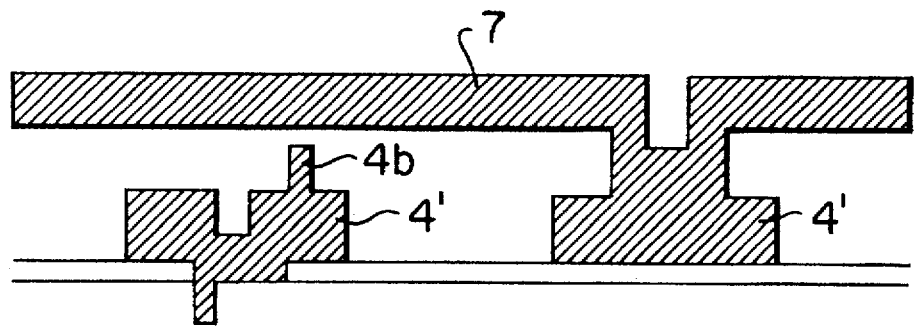
Figure 1H:
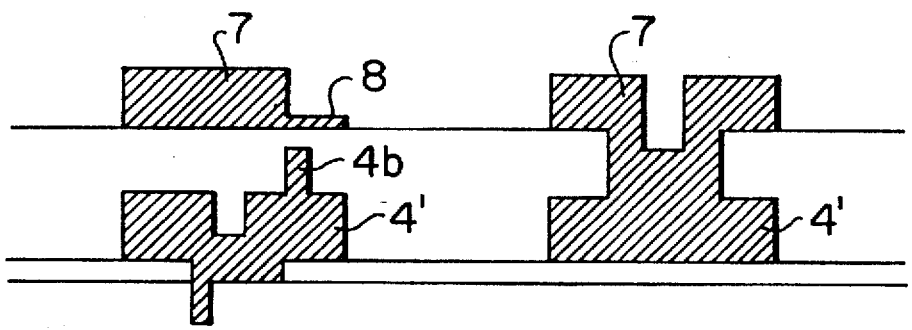

A second level 7 (FIG. 1g) of high coefficient of thermal expansion interconnect material is deposited. The second level of interconnect material 7 is etched in a manner similar to the first level (FIG. 1h). The topography of the underlying films, coupled with the high surface reflectivity of this interconnect material, may cause parasitic light reflections that result in the formation of notches 8 in the interconnect material (to be discussed in more detail below).

The above sequence is repeated as many times as necessary if more than two levels of interconnect material are needed. Finally a top protective layer 9 is deposited.

The formation of hillocks will now be discussed in more detail. Semiconductor devices use aluminum alloys and other high electrical conductivity and high coefficient of thermal expansion metals such as copper alloys, gold, and the like as interconnect materials and use low electrical conductivity and low coefficient of thermal expansion insulators such as inorganic glasses (SiO2, PSG, BPSG), polyimides and other inorganic or organic materials as dielectrics to isolate these interconnect materials. The interconnect materials are deposited over isolation dielectrics at temperatures exceeding room temperature and are then typically under tensile stress when brought back to room temperature for their patterning.

During wafer temperature ramp-up from room temperature to the deposition temperature of the isolation dielectric, which is typically ranging from 350° to about 500° C., stress of the interconnect materials changes from tension to compression.

Figure 2:
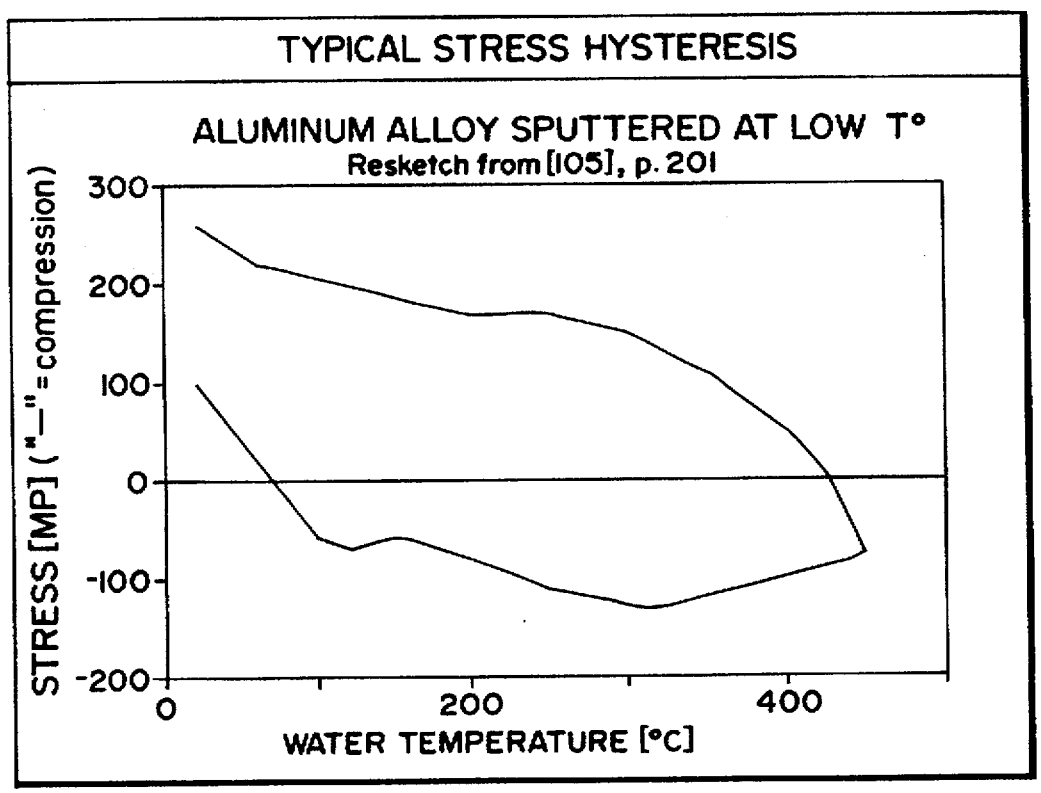
FIG. 2 shows the stress hysterisis in a sputtered aluminum alloy.

During wafer temperature cool-down to room temperature, stress will revert to tension. Such a hysteresis curve, which gives rise to hillock formation, is shown in FIG. 2 for an aluminum alloy. This aluminum alloy stress versus wafer temperature is characterized by at least seven regions, or slope variations. Each of these seven regions will now be described.

Region 1, from 25° to about 100° C., is the temperature ramp-up elastic deformation of the aluminum alloy that results from a mismatch of its coefficient of thermal expansion and that of the dielectric previously deposited. This stress behaviour is reversible. There is no hysteresis if the wafer temperature is returned to 25° C.

Region 2, from 100° to about 160° C., corresponds to the temperature ramp-up softening of the film resulting from recrystallization and grain growth. This grain growth eliminates dislocations from the amorphous matrix (between the crystallites of the aluminum alloy) during the formation of new grain boundaries. These newly formed grains give to the film a reduced strength and hardness. This grain growth is driven by a reduction of the grain boundary area and energy.

Region 3, from 160° to about 300° C., is the temperature ramp-up elastic/plastic transition region resulting from very soft materials like aluminum alloys for which elastic and plastic regions are not well defined and for which a slight permanent deformation may take place even for very small stresses. When stress is lower than the aluminum alloy's compression yield stress, strain is purely elastic and, when it is higher, there is also plastic strain that tends to make the stress less compressive. Since the aluminum alloy's compression yield stress depends on grain size, and since this region is under constant grain growth, there is a variable equilibrium between elastic and plastic deformations, thus resulting in a variable stress versus temperature slope. Small protrusions, called hillocks, begin to form as a result of the larger and larger compressive stress.

Region 4, from 300° to about 450° C., is the temperature wrap-up plastic deformation region where stress no longer increases with temperature because of a reduced aluminum alloy compression yield stress at high temperature. This is the region of hillock growth on the aluminum alloy surface that results from excessive compressive stress.

Region 5, from 450° to about 415° C., is the temperature cool-down elastic deformation due to the mismatch of the coefficients of thermal contraction upon cooling. The stress versus temperature slope is smaller than the equivalent slope of the temperature ramp-up elastic deformation upon first heating (from 25° and about 100° C.) because both the aluminum alloy and the dielectric films have smaller elastic nodules at high temperatures than at room temperature.

Region 6, from 415° to about 250° C., is the temperature cool-down elastic/plastic transition region resulting from tensile stress exceeding the aluminum alloy's tension stress yield. As the wafer temperature is reduced, the aluminum alloy's tension stress yield increases and this causes the stress-temperature slope to vary between 415° and 250° C. This region is characterized by the appearance of dislocations in the aluminum alloy matrix that permits the reduction of the energy stored at the grain boundaries. The limiting step is the generation of dislocation loops. A long exposure of the aluminum alloy in that temperature region would cause excessive amount of micro-dislocations to be generated and cracks to appear. The irreversible plastic deformation upon heating, that caused the apparition of hillocks, also contributes to this other irreversible plastic deformation upon cooling, called stress migration.

Region 7, from 250° to about 25° C., is the temperature cool-down precipitation hardening resulting from intermetallic compounds precipitation at grain boundaries. For example, a copper containing aluminum alloy has a solid solubility of 0.045 atomic percent at 225° C. and excess copper precipitates out as θ-phase, $Al_2Cu$. A β-phase silicon will also precipitate out as the temperature drops, and this can result in limited hardening. The difference is that silicon tends to form nodules as large as 1.0 μm because of the very fast diffusion rate of silicon in aluminum alloys. Dislocations interacting with one another also have hardening effects.

Hillock formation and growth, that occur in regions 3 and 4 of the stress hysteresis curve, have a very significant effect on the yield and reliability of semiconductor devices.

Figure 1A:
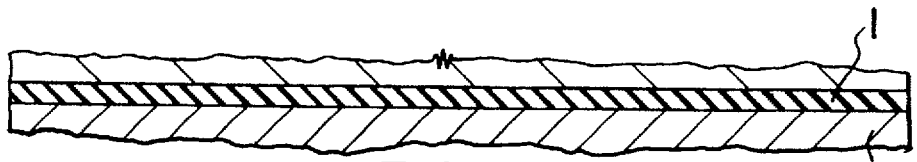
FIGS. 1a to 1i illustrate the steps in the formation of a multilevel integrated circuit showing the formation of hillocks and spikes.
Figure 1B:
Figure 1C:
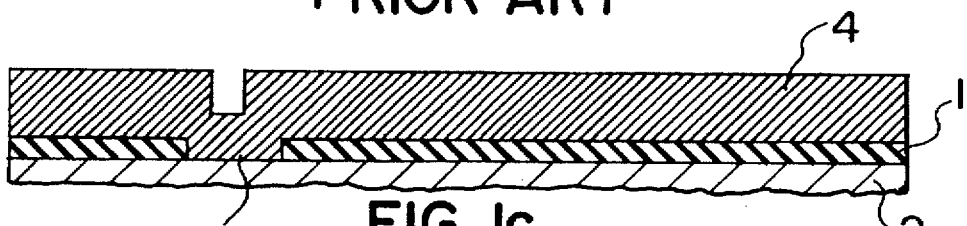
Figure 1D:
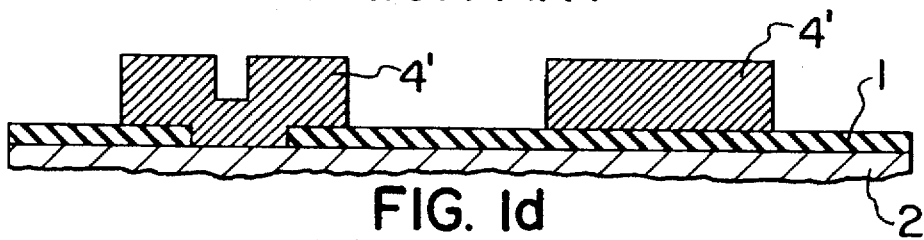
Figure 1E:
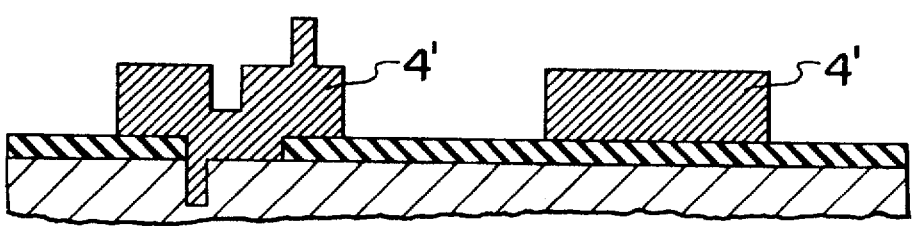
Figure 1F:
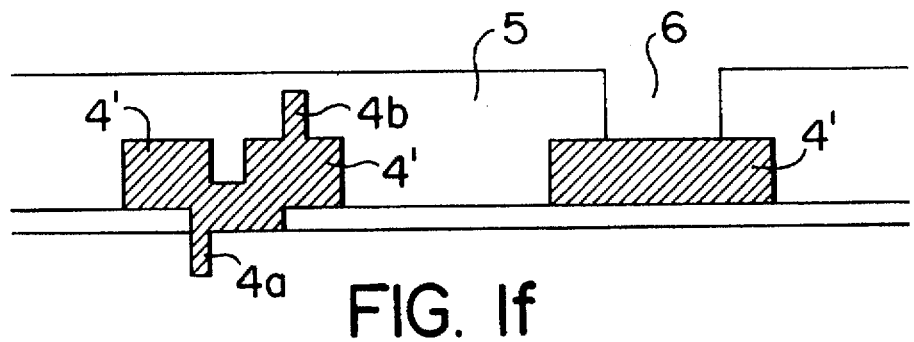
Figure 3:
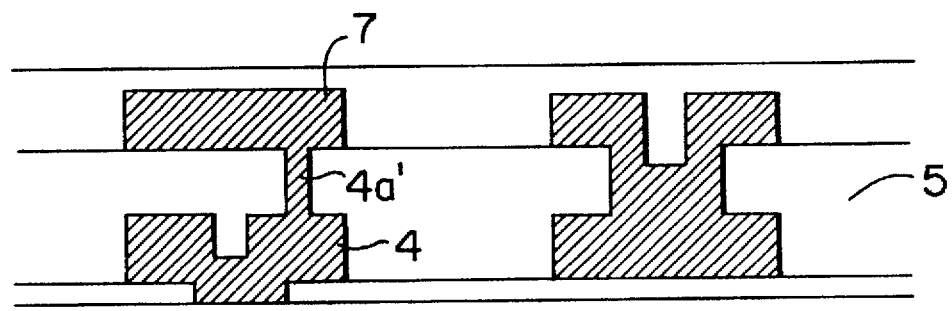
FIG. 3 shows the effect of hillock formation in a multilayer device.

FIG. 3 illustrates one of the most frequent yield loss mechanisms, namely a short 4a' between two interconnect levels due to the growth of large hillocks with heights that exceeds the thickness of the dielectric layer 5. The resulting device will be defective during electrical testing performed at the end of its manufacture because of the electrical short between first and second levels of interconnect. This defect easily detected and contributes to process yield loss.

A more subtle hillock-related defect causes a reliability loss without yield loss. The most common such defect is the non-shorting inter-level hillock 4a" (FIG. 4) due to the growth of large hillocks with heights that do not exceed the dielectric thickness.

Such a device will probably not be eliminated as defective during its electrical testing at the end of its manufacture, and will probably not contribute to process yield loss. The high electrical field generated near the tip of hillocks will nevertheless slowly degrade the isolation characteristics of the surrounding dielectric and probably cause a catastrophic failure during the expected life of the device. This defect is hard to detect, does not contribute to process yield loss, and results in a hard to predict reliability loss.

Hillock suppression is very important for devices manufacturing yield improvement as well as for their reliability. As discussed above, hillock suppression can be achieved by depositing a thin layer of a high mechanical strength, low coefficient of thermal expansion, and low defect density material over the aluminum alloy of the first level of interconnect prior to deposition of the upper dielectric. The top film of such material inhibits hillock formation from the aluminum alloy by mechanically restricting its vertical movement and its low defect density prevents the aluminum alloy from penetrating it and forming extrusions.

While hillocks can be suppressed with a Ti:W layer, Ti:W suppression is generally unsatisfactory for the reasons stated above.

To verify the efficiency of hillock suppression with the aid of a titanium nitride TiN barrier layer, a 0.10 μm thick reactively sputtered TiN "anti-hillock" layer was deposited over 0.80 to 1.00 μm thick Al-1.0% Si–0.5% Cu aluminum alloy layers sputtered over nine silicon wafers.

These dual layer films were compared with 0.80 to 1.00 μm thick single layer films of sputtered Al- 1.0% Si–0.5% Cu aluminum alloy over nine other silicon wafers. The as-deposited hillock size was measured by scanning the top surface of the wafer with a SLOAN DEKTAK II profilometer over a distance of 1 mm. The maximum detected height of each one of the eighteen as-deposited wafers are presented as "BEFORE" in the Table 1.

These eighteen wafers were then cycled through nine consecutive temperature cycles, each cycle consisting of a temperature ramp-up of the wafer from 25° to 425° C., a stabilization for fifty minutes, and a ramp-down to 25° C. Hillock size was remeasured; the maximum detected height of each wafer are presented as "AFTER" in the table.

TABLE I

| #  | TiN | BEFORE (nm) | AFTER (nm) | #  | TiN  | BEFORE (nm) | AFTER (nm) |
|----|-----|-------------|------------|----|------|-------------|------------|
| 01 | NO  | 25.9        | 1453.7     | 10 | YES  | 18.9        | 81.3       |
| 02 | NO  | 26.0        | 1704.0     | 11 | YES  | 33.2        | 57.2       |
| 03 | NO  | 27.2        | 574.9      | 12 | YES  | 59.2        | 64.7       |
| 04 | NO  | 46.0        | 1076.6     | 13 | YES  | 65.9        | 68.0       |
| 05 | NO  | 23.4        | 1852.2     | 14 | YES  | 40.2        | 75.9       |
| 06 | NO  | 38.1        | 559.9      | 15 | YES  | 40.0        | 53.5       |
| 07 | NO  | 29.4        | 1332.9     | 16 | YES  | 97.3        | 108.4      |
| 08 | NO  | 31.7        | 1207.9     | 17 | YES  | 91.5        | 125.9      |
| 09 | NO  | 43.4        | 1320.9     | 18 | YES  | 64.1        | 72.5       |
|    | AVG | 32.3        | 1231.4     |    | AVG. | 56.7        | 78.6       |

The average maximum hillock height of the aluminum alloy films and TiN covered aluminum alloy was 32.3 and 56.7 nm respectively for as-deposited films. The corresponding average maximum was 1231.4 and 78.6 nm respectively after these nine heat treatment cycles. The use of this top "anti-hillock" TiN layer reduces hillock growth by about 94% and eliminates the risks of inter-level electrical breakdowns.

Figure 5A:
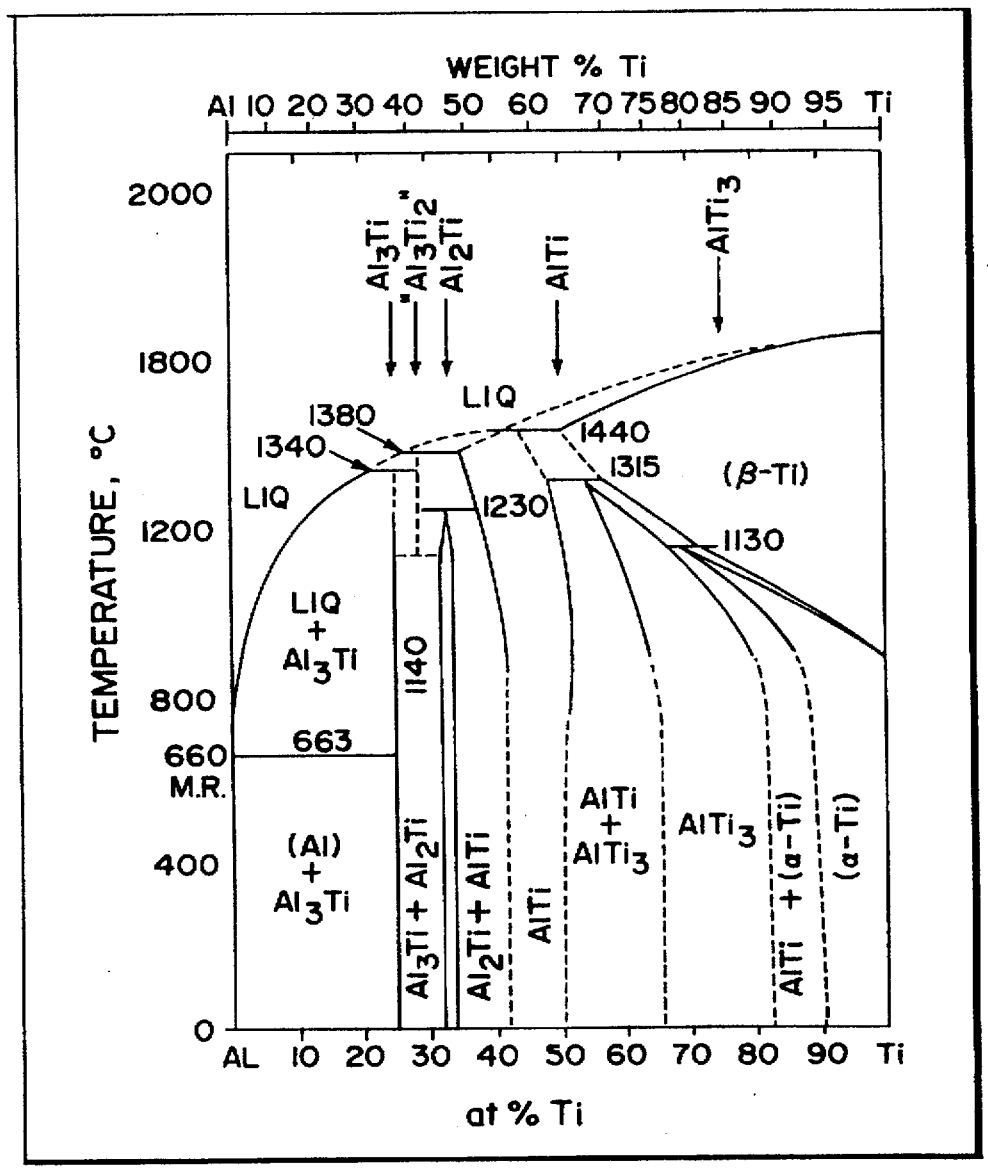
FIGS. 5a and 5b are phase diagrams for titanium aluminum alloys.
Figure 5B:
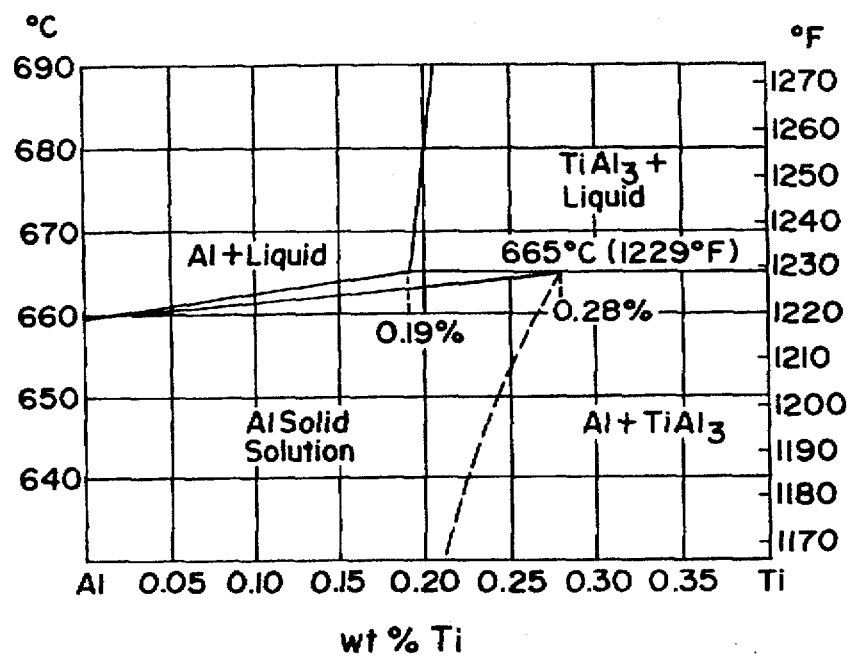

However, the use of a titanium nitride barrier layer is also associated with problems as outlined above. Referring to FIGS. 5a and 5b, which show aluminum-titanium phase diagrams, these two examples show that a 1.0 μm thick film of aluminum alloy film can dissolve about 0.25 wt. % Ti at 525° C., which represents about 1.80 nm of pure Ti, or all the titanium contained in about 2.06 nm of face centered cubic δ-TiN, or about 4.1 % of all the titanium contained in a 50.0 nm thick TiN barrier.

Even though TiN appears to be a much more useful anti-hillock layer than Ti:W, the metallurgical activity at the Al-TiN interface is not negligible, and even though an aluminum alloy cannot attack single phase face centered cubic titanium nitride, δ-TiN, at temperatures lower than 550° C., dissolution of titanium is possible and can result in the saturation of the aluminum alloy with titanium, and its precipitation, as $Al_3Ti$, upon cooling.

A further problem in the fabrication of semi-conductive devices is the formation of spikes. This is a metallurgical problem which can be better understood with reference to FIG. 6. This phase diagram shows that, for any temperature lower than the 577° C. solidus temperature, silicon will diffuse away from the monosilicon-aluminum alloy and polysilicon-aluminum alloy interfaces and dissolve in the aluminum alloy to form an a-phase, an aluminum-rich phase which has some silicon in solid solution, and β-phase, crystals of almost pure silicon with very little aluminum.

The speed of this dissolution process is limited by the diffusion coefficient of silicon in aluminum alloys, which increases rapidly with temperature, as shown in the table 2 for diffusion times of three and sixty minutes:

TABLE 2

| T [°C.] | D [cm²/sec] | SQRT(Dt) [μm/3 min] | SQRT(Dt) [μm/60 min] |
|---|---|---|---|
| 162 | 1.5 E – 11 | 0.52 | 2.33 |
| 181 | 3.3 E – 11 | 0.77 | 3.44 |
| 203 | 7.1 E – 11 | 1.13 | 5.05 |
| 227 | 1.5 E – 10 | 1.64 | 7.33 |
| 282 | 3.3 E – 10 | 2.44 | 10.91 |
| 315 | 7.4 E – 10 | 3.65 | 16.32 |
| 352 | 1.6 E – 09 | 5.36 | 23.97 |
| 394 | 3.5 E – 09 | 7.93 | 35.46 |
| 441 | 8.0 E – 09 | 12.00 | 53.66 |
| 496 | 1.7 E – 08 | 17.49 | 78.22 |
| 560 | 3.9 E – 08 | 26.50 | 118.51 |

The very rapid diffusion of silicon in aluminum alloys at any temperature lower than the solidus temperature, even at temperatures as low as 162° C., results in rapid dissolution of silicon from monosilicon-aluminum alloy and polysilicon-aluminum alloy interfaces and spiking of the created voids, in the surface of monosilicon and polysilicon, with the obtained aluminum alloy solid solution. This dissolution stops when the limit of solid solubility of silicon in the aluminum alloy is reached. At that point in time, and at that temperature, all the dissolved silicon is in the single α-phase solid solution. Since the content of silicon in this α-phase is equivalent to its limit of solid solubility in the aluminum alloy, it is possible to estimate the monosilicon and polysilicon dissolution:

$$\delta = 2(Dt)^{1/2}(wd/A)(S\sigma_{AL}/\sigma_{Si})$$

where "σ" is the dissolution depth of the monosilicon or polysilicon present at the bottom of a contact patterened in deposited oxide, "t" is the exposure time at that temperature, "w" is the metal line width, "d" is the aluminum alloy thickness, "A" is the area of the contact, "S" is the limit of solid solubility, in wt. %, of silicon in the aluminum alloy at the test temperature, and "$S\sigma_{AL}/\sigma_{Si}$" is the ratio of the density of aluminum and silicon.

Monosilicon dissolution depths are calculated for exposure times of three and sixty minutes at various temperatures ranging from 227° to 577° C., for a metal line width of 2.0 μm, for an aluminum alloy thickness of 1.0 μm, and for contact area of 1.5 μm²:

TABLE 3

| T [°C.] | S [wt. % Si] | D [cm2/sec] | δ (3 min) [μm] | δ (60 min) [μm] |
|---|---|---|---|---|
| 227 | 0.01 | 1.5 E – 10 | 5.1 E – 04 | 2.3 E – 03 |
| 277 | 0.04 | 3.0 E – 10 | 2.9 E – 03 | 1.3 E – 02 |
| 327 | 0.10 | 1.0 E – 09 | 1.3 E – 02 | 5.8 E – 02 |
| 377 | 0.25 | 2.5 E – 09 | 5.2 E – 02 | 2.4 E – 01 |
| 427 | 0.45 | 6.0 E – 09 | 1.5 E – 01 | 6.7 E – 01 |
| 450 | 0.48 | 8.5 E – 09 | 1.9 E – 01 | 8.5 E – 01 |
| 477 | 0.70 | 1.3 E – 08 | 3.3 E – 01 | 1.5 E + 00 |
| 527 | 1.10 | 2.0 E – 08 | 6.5 E – 01 | 2.9 E + 00 |

These results show that an exposure of an aluminum-monosilicon interface for three minutes at 425° C. or sixty minutes at 375° C. is enough to spike through 0.25 μm deep junctions. This spiking depth is conservative because it assumes that the monosilicon-aluminum alloy or polysilicon-aluminum alloy interface is free from native oxide.

If a native oxide thicker than about 1.5 nm is present at the interface, the low diffusion coefficient of silicon in silicon oxide at these temperatures causes the effective metallurgical area, "A", to be much smaller than the geometric contact area; monosilicon or polysilicon dissolution takes place only at a few points of the bottom of the contact and its dissolution depth is much larger than the ones predicted in the previous table; spikes deeper than 0.8 μm are seen for 30 minutes heat treatment at 400° C.

Polysilicon-aluminum alloy interfaces are much more prone to silicon dissolution than monosilicon-aluminum alloy interfaces because silicon diffuses much more rapidly on polysilicon grain boundaries than in its bulk volume; silicon is consumed at polysilicon grain boundaries and precipitates on a neighbouring grain boundary or away from the polysilicon-aluminum alloy interface as isolated single crystal β-phase silicon-rich nodules within the aluminum alloy. The original continuous film of polysilicon is locally totally dissolved as pits as large as 1.0 μm in diameter, filled with aluminum.

The dissolution of the polysilicon in aluminum alloys is related to polysilicon grain structure, to heat treatment, doping type and doping level. For example, a 625° C. LPCVD deposited undoped polysilicon has a (110) colomnar structure and, even after extensive heat treatments at temperatures of about 900° C., remains rapidly soluble in aluminum alloys because its colomnar structure is not affected by such a heat treatment. By contrast, a 570° C. LPCVD deposited polysilicon film is almost amorphous with a few little crystals having various orientations and, after phosphorus implantation and heat treatments to similar temperatures, has very large grains, no preferential crystal orientation, and very slow dissolution similar to the one of monosilicon.

Arsenic implanted polysilicon as well as boron implanted polysilicon shows severe interface dissolution and precipitation.

Reduction of gate oxide by aluminum

at the bottom of these dissolution pits can occur and cause device failure due to capacitor breakdown. The dissolution of monosilicon, called junction spiking, is detected by reverse leakage current measurements of diodes at sources and drains and is know to be a very serious problem for shallow junction.

Figure 6:
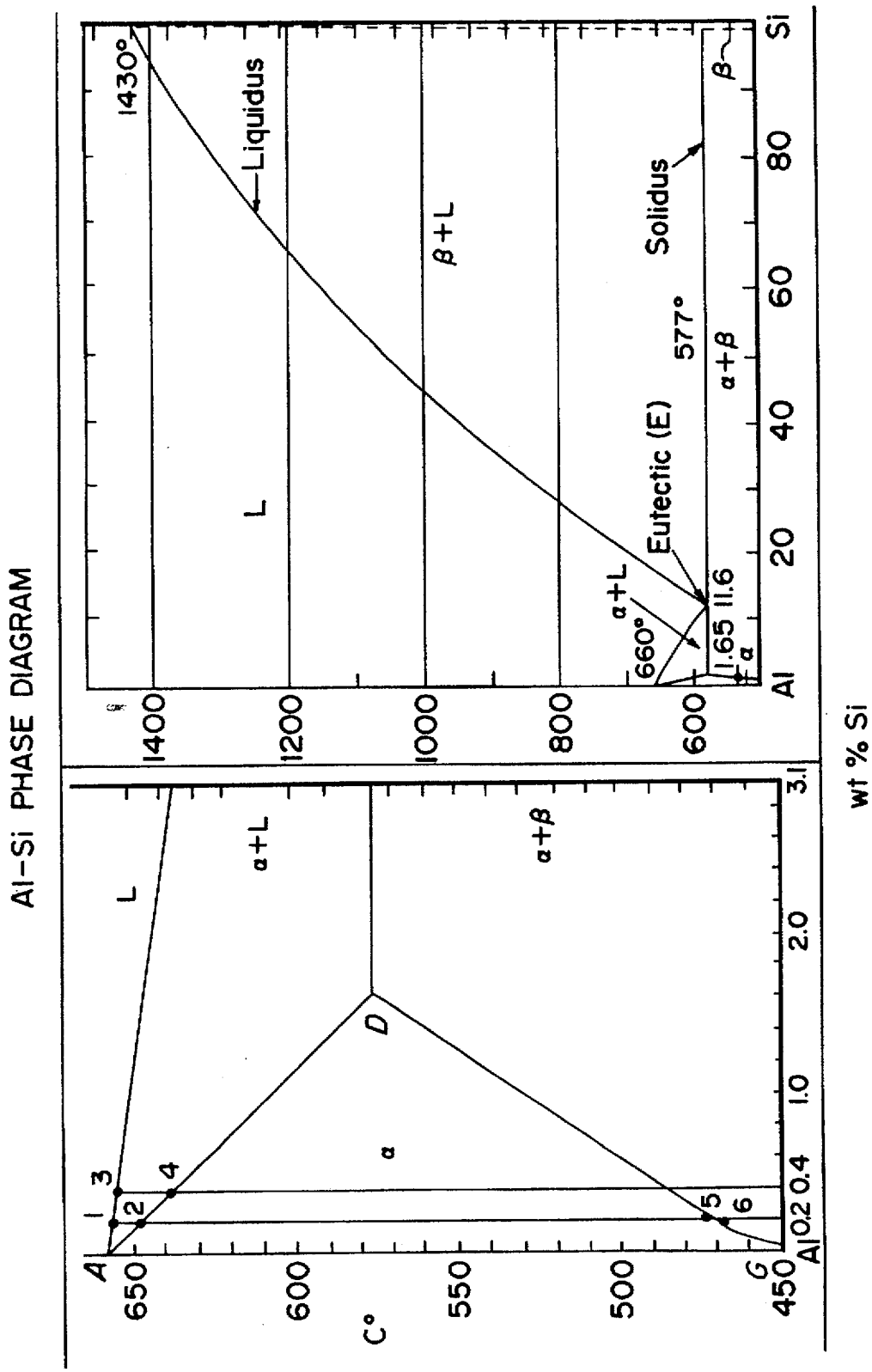
FIG. 6 is an aluminum silicon phase diagram.

Junction spiking is not the only problem associated with this dissolution of the interface. Because the limit of solid solubility of silicon decrease with temperature, the solid solution becomes super-saturated with silicon and, as the wafer cools-down, excess silicon precipitates in the aluminum alloy as silicon-rich β-phase; the composite of this β-phase being about 99.0 wt. % Si and 1.0 wt. % Al, as shown in FIG. 6. This β-phase precipitation occurs in the bulk of the aluminum alloy and takes the form of large diameter "silicon" nodules, some of them having more than 1.0 µm in diameter. The formation of these nodules cause serious reliability problems, such as electromigration and stress migration.

The precipitation of this excess silicon as an aluminum doped silicon-rich β-phase also occurs as epitaxial β-phase silicon on source and drain monosilicon. This affects Schottky diode current characteristics:

$$I=AJ \ (\exp \ [qV/nkT)]-1)$$

$$J=RT^2 \ \exp \ [-q\psi/(kT)]$$

where "A" is the area of the diode, "n" is the idealize factor, and "R" is Richardson's constant.

Aluminum alloy spiking at the monosilicon interface at high temperature, when not catastrophic, can change the effective area, "A", of the contact, but this is not likely to affect the turn-on voltage of the diode by too much.

The precipitation of the aluminum doped silicon-rich β-phase at the monosilicon-Aluminum alloy interface upon cooling affects the barrier height and the turn-on voltage more strongly. It has been shown electrically that the recrystallization of this aluminum doped β-phase acts as a P-type layer, leading to increased barrier height for electrons moving between the N-type monosilicon or polysilicon and the aluminum alloy.

Contact resistance to N-type monosilicon sources, and drains as well as polysilicon gates are seriously affected by this precipitation of the P-type β-phase upon cooling, and the problem becomes more serious as contact area is reduced.

A titanium nitride layer can also be used for effective spike suppression. Titanium nitride is easily etched in chlorine based plasmas and its etching does not result in the formation of local stalagmites and stringers of TiN due to local residues of aluminum alloy, as is the case for Ti:W.

TiN is reactively sputtered from pure Ti targets which can be made extremely pure with virtually no porosity, can have very fine grains that prevent particle problems on the metallized wafer, can be very low in mobile ions and thus compatible with high quality CMOS device requirements, do not suffer from target composition fluctuations or sputtering reproducibility problems and are less expensive than Ti:W targets.

It is possible to reactively sputter single phase face centered cubic titanium nitride, δ-TiN, which B-1 NaCl crystal structure and (111), (220) and (200) crystal orientations, when the sputtered TiN contains more than about 38.0 at. % N; titanium and nitrogen forming two face centered cubic, FCC, sublattices.

Increasing the nitrogen content results in a decrease of vacancies in the N sublattice and an increase of the (111)/(200) and (220)/(200) X-ray diffraction normalized intensities of this single δ-phase TiN up to maximum values of about 0.75 and 0.53 respectively as nitrogen reaches slightly less than 50.0 at. %. The (111), (220) and (200) inter-planer spacings also peak to a maximum at this optimum. The obtained optimum single δ-phase TiN is fully dense, almost completely reacted, quasi-stoichiometric with almost no vacancies in the N sublattice, has a maximum density, a maximum hardness, and a minimum electrical bulk resistivity.

As measured by RBS and diode contact resistivity measurements, this single phase and optimized δ-TiN is capable of suppressing silicon-aluminum alloy inter-diffusion and associated β-silicon precipitation and aluminum alloy spiking of shallow junctions, for more than 30 minutes at temperatures as high as 550° C.

This silicon-aluminum alloy interface stabilization is limited by the penetration and chemical attack of δ-TiN by the aluminum alloy, which is only possible at temperatures higher than about 550° C. because of a very low coefficient of diffusion of aluminum in δ-TiN at lower temperatures and because its Gibbs free energy becomes negative only at such high temperatures:

4 Al+δ-TiN=δ-AlN+TiAl$_3$ ($T \geq 500°-600°$ C.)

Because titanium is well bonded in optimized single phase face centered cubic δ-TiN crystals, it does not penetrate and dissolve in the aluminum alloy at high temperatures and, upon cooling, precipitates, at aluminum alloy grain boundaries, as aluminum rich intermetallic precipitates, TiAl$_3$:

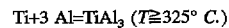
Ti+3 Al=TiAl$_3$ ($T \geq 325°$ C.)

Since titanium present at δ-TiN grain boundaries is relatively poorly bonded, it may break its surface bonds, penetrate and chemically attack the aluminum alloy and form TiAl$_3$ precipitates upon cooling. If this hypothesis is true, the thermal stability of single phase δ-TiN would depend on grain boundaries condition.

This is confirmed by the fact that substrate bias induced reduction of the inter-grain volume and porosity and oxygen poisoning of grain boundaries have very important effects on spike and δ-phase silicon precipitation suppression efficiency.

The properties and crystal structure of reactively sputtered single phase face centered cubic titanium nitride, δ-TiN, can be largely modified by low energy ion bombardment during deposition. Such reactively bias sputtered technique is also called reactive ion plating.

This can be achieved by imposing a small and controlled negative bias to the wafer, with respect to the sputtering chamber's ground. The application of a small negative bias of the order of 50 to 200 volts during reactive sputtering of δ-TiN has many effects:

It reduces its 293° K bulk resistivity from more than 250 µΩ.cm to about the poly-crystalline theoretical resistivity of 20.0 µΩ.cm It increases its density from less than 3.5 to about the theoretical density of 5.2 g/cc due to the reduction of the inter-grain volume and porosity and due to transition from zone 1 columnar structure to zone T transition structure It reduces the oxygen present at the grain boundaries as titanium oxides and titanium oxynitrides from more than about 15.0 to less than about 1.0 at. % 0

It modifies its colour from dark purple to its characteristic bright gold

It modifies its intrinsic stress from slightly tensile to highly compressive at about $5.0 \times 10$ E+10 dynes/cm$^2$ It modifies its crystal orientation It increases the surface mobility of absorbed titanium and nitrogen atoms It increases its lattice parameter due to small incorporation of argon It increases its micro-hardness It stabilizes its grain boundaries against ambient oxidation due to reduction of its inter-grain volume and porosity (inter-grain spacings as large as 3.0 nm were seen throughout the thickness of unbiased δ-TiN films It reduces its resistivity temperature coefficient from more than 0.3 to less than 0.06 μΩ.cm/°C.

It reduces its Hall coefficient from 1.3 to $1.0 \times 10$ E-4 $cm^3/°C$.

It reduces its 77° K residual bulk resistivity from more than 250 to less than 13.5 μΩ.cm And finally it increases its barrier performance due to a reduction of its inter-grain volume and porosity.

Reactive sputtering of titanium nitride in a (98.80% argon—1.20% nitrogen) gas mixture without the application of a negative bias on the wafer permits the formation of a "P" dark purple δ-TiN having a density of 3.22 g/cc, and intrinsic tensile stress of $1.0 \times 10$ E+7 dynes/cm$^2$, a bulk resistivity of 400 μΩ.cm, and an oxygen content of 5.0 to 8.0 at % 0, even though oxygen is not deliberately introduced in the sputtering chamber (base pressure is $1.0 \times 10$ E-6 Torr and sputtering pressure is $2.5 \times 10$ E-2 Torr).

Reactive sputtering of titanium nitride in a (98.80% argon—1.20% nitrogen) gas mixture with the application of a −75V negative bias on the wafer permits the formation of a "G" bright gold δ-TiN having a density of 4.98 g/cc, a high intrinsic compressive stress of $1.9 \times 10$ E+10 dynes/cm$^2$, a bulk resistivity of 20.0 μΩ.cm, and an oxygen content of less than 1.0 at % 0.

Reactive sputtering of titanium nitride in a (98.72% argon—1.20% nitrogen—0.08% oxygen) gas mixture with the application of a −75V negative bias on the wafer permits the formation of an "Ox" bright gold δ-TiN having a high intrinsic stress of $1.8 \times 10$ E+10 dynes/cm$^2$, a bulk resistivity of 25 μΩ.cm, an oxygen content of 2.0 at % 0, and an increased contact resistivity to silicon, as measured by cross-bridge Kelvin resistor contact resistance structures.

The oxygen stuffing has no effect on silicon penetration in δ-TiN since it does not diffuse through any of the three ("P", "G", and "Ox") types of δ-TiN at temperatures as high as 500° C.

On the other hand, oxygen stuffing of δ-TiN grain boundaries has a very important effect on the diffusion and dissolution of titanium in aluminum alloys and on its precipitation as the intermetallic phase, $TiAl_3$, upon cooling.

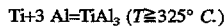

$Ti+3 Al=TiAl_3$ $(T \geq 325°\ C.)$

This shows that titanium present at δ-TiN grain boundaries is relatively poorly bonded, that it may break its grain surface bonds, diffuse and dissolve in the aluminum alloy, and form $TiAl_3$, precipitates upon cooling.

The oxygen is believed to stabilize the titanium which is poorly bonded to the grain boundaries by forming titanium oxides and titanium oxynitrides.

Figure 1I:
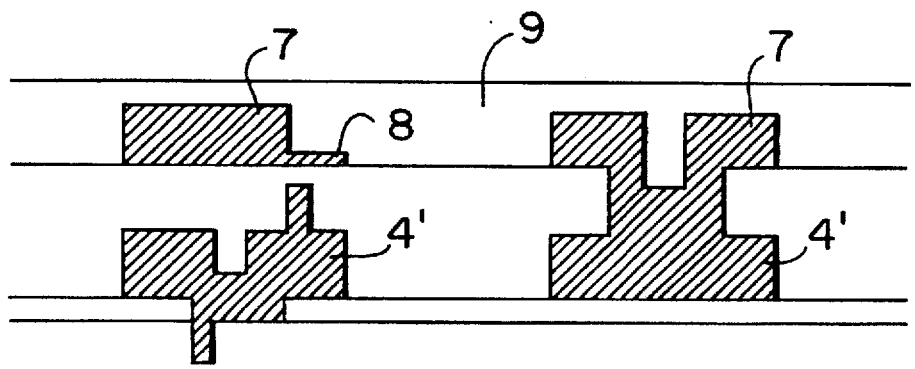

A further problem with aluminum alloy layers arises from their high reflectivity, which causes degradation to occur in photoresist images through standing wave effects and reflective light scattering, resulting in the formation of notches 8 (FIG. 1i).

Figure 7:
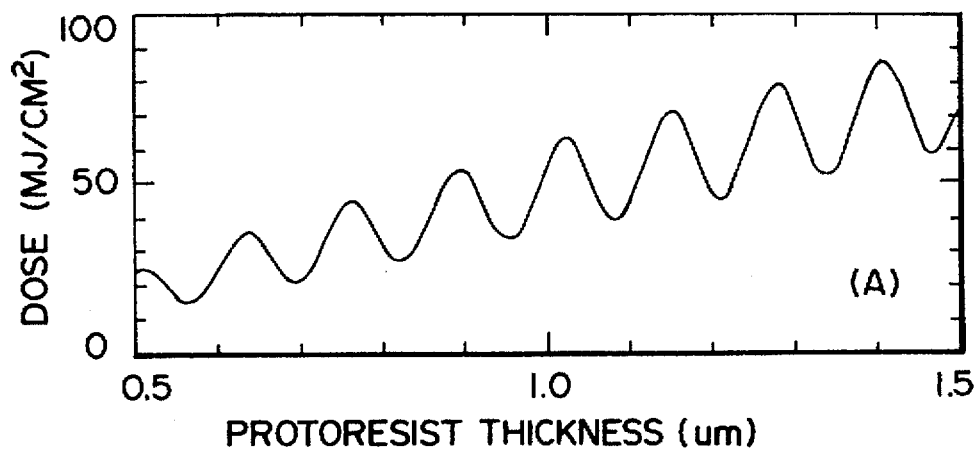
FIG. 7 is a sample simulation of the normal exposure dose required for control of positive-photoresist patterns on aluminum alloy layers.

FIG. 7 shows a sample simulation of the nominal exposure dose required for the control of 1.0 μm wide positive resist patterns as a function of resist thickness coated on aluminum coated substrate, without topography. The gradual rise of the curve is caused by the resist bulk effect while the periodic variation is caused by the standing wave effect.

These exposure dose fluctuations, exceeding about 60% of the nominal dose at a nominal photoresist thickness of about 1.00 μm, are due to standing waves formed by light underlying aluminum surography-free underlying aluminum surface.

Figure 8:
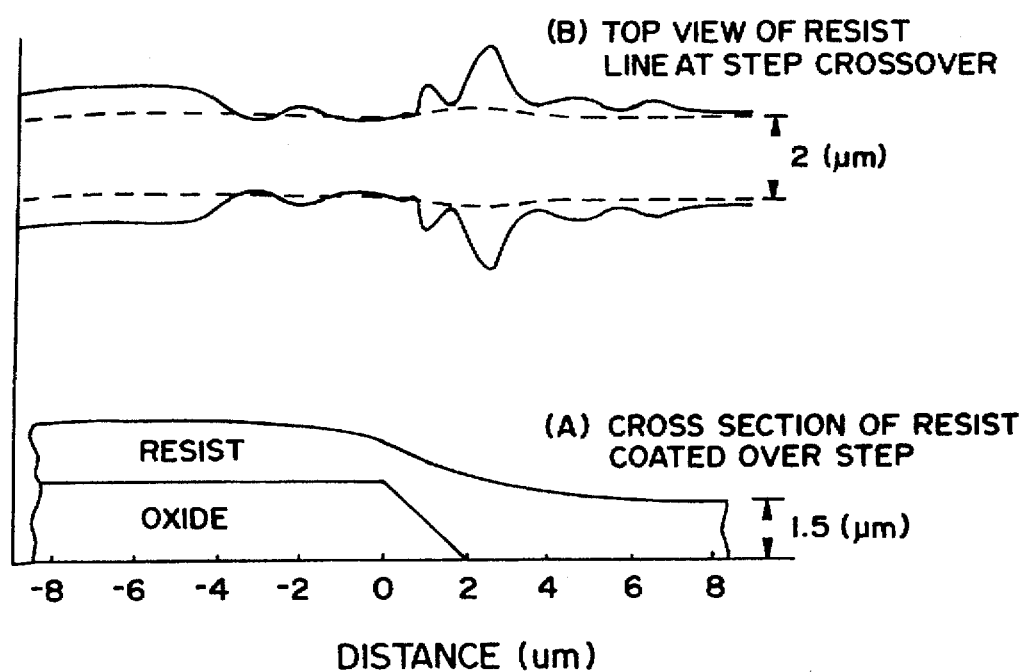
FIG. 8 shows a sample simulation of the thickness profile of 1.5 µm normal thickness resist layer.

Local topography induces another linewidth control problem because of a local variation of resist thickness over non-planar surfaces. This effect is shown in FIG. 8, which shows a sample simulation of the thickness profile of a 1.5 μm nominal thickness resist over 2.00 μm tapered oxide stop patterned over a silicon wafer to simulate typical "smooth" oxide with 45° surface angles. Also shown are the associated linewidth fluctuations of the 2.00 μm wide photoresist linewidth with (dotted lines) and without (solid lines) the use of an antireflective layer that eliminates the standing wave effect. Note that there is still a residual linewidth variation for the case with an antireflective layer. This is contributed from the bulk variation in resist thickness as it covers the step.

To illustrate the relative magnitude of bulk and standing wave effects, consider the case where a vertical aluminum step is coated with resist. For a 0.50 μm vertical aluminum step and for a 1.50 μm thick resist coating, the thinnest resist is measured to be 1.42 μm at the top of the step and the thickest is measured to be 1.92 μm, at the bottom. The exposure dose graph presented before predicts an exposure difference, required to compensate the bulk effect, of 30 mJ/cm$^2$. A similar exposure difference due to standing wave effect is about 43 mJ/cm$^2$ Therefore, the standing wave effect accounts for about 59% of the total exposure difference between optimum exposure of the resist at the top of the step and its optimum exposure at the bottom of the step.

FIG. 9 summarizes the percentage contribution of the standing wave effect to the total exposure difference versus the step height for a 1.5 μm thick photoresist. For a large step height to 0.8 μm, more that 50% of the variation of the step can be reduced by completely suppressing the standing wave effect.

In the case of semi-planar dielectrics, obtained by spin-on glass or reflow techniques, step height of inter-level dielectrics is much smaller than 0.80 μm and tend to decrease as line spacing is reduced. This phenomenon is due to gap filling induced by surface tension effects. This means that almost all of the linewidth as well as contact and via hole diameter variation of devices having semi-planar dielectric is due to standing wave effects; the relative magnitude standing wave effect increasing as step height is reduced.

Advanced devices with very small interconnect linewidth and spacing that use spin-on glass or reflow techniques can have a relative magnitude standing wave effect of about 90% since their associated dielectric step heights can be smaller than about 0.10 μm. In this case, this variation can be almost completely suppressed by the use of an effective antireflective layer between aluminum alloy and resist.

"Notching" problems become worse at smaller geometries and require the use of an effective antireflective layer to eliminate such standing wave and parasitic reflections effects.

The use of reactively sputtered TiN as an antireflective layer for notch suppression has been shown to be effective. Films of TiN with different nitrogen to titanium ratios and different lattice parameter have different colour, from dark purple ("P") to bright gold ("G"), and reflectance.

The total reflectance spectrum of single phase δ-TiN shows a decrease of reflectance as photon energy increases, shows a knee in the near infrared to red region between 1.4 and 2.3 eV (885 and 550 nm), and shows a minimum in the violet to near ultraviolet region between 2.7 and 4.0 eV (460 and 300 nm).

The total reflectance spectrum of stoichiometric δ-TiN shows a knee at about 1.4 eV (825 nm), shows a minimum of about 15% total reflectance at 2.7 eV (460 nm), shows a total reflectance of about 15 % used in photolithography, shows a total reflectance of about 17% for the 365 nm (3.40 eV) "i" line of steppers used in advanced photolithography, and shows that the position of the knee and of the minimum are not affected by stoichiometry for nitrogen to titanium ratios between 0.9 and 1.1.

Further reduction of the N/Ti ratio of single phase μ-TiN from 1.00 to 0.75 pushes the position of the knee from 1.4 to 2.3 eV (885 to 550 nm), pushes the position of the minimum from 2.7 to 4.0 eV (460 to 300 nm), increases the total reflectance of this minimum total reflectance from 15 to 50%, and increases the "I" line total reflectance from 17 to 40%.

Composition stoichiometry of single phase δ-TiN is not the only factor that control TiN total surface reflectance; grain structure and orientation plays a key role.

If the preferential orientation obtained by reactive bias sputtering or reactive ion plating of single face centered cubic δ-TiN is replaced by (220), (200), or (311) orientations, the colour and total reflectance are modified.

A reduction of room temperature deposition rates of δ-TiN from 0.25 to 0.05 μm/main increases the argon incorporation from 0 to more than 1.0 wt % which modifies lattice parameter, increases lattice distortion, and modifies the grain structure by reducing and increasing (200), (220) and (311) grain orientations. These deposition rate related grain structure effects affect the absolute reflectance and colour and hence the antireflective properties of δ-TiN in "g" line and "i" line photolithography.

The deposition of this optimized δ-TiN is quite easy on planar surfaces, without topography, and particularly if RF bias is used (reactive bias sputtering or reactive ion plating in ultra-high vacuum sputtering equipments.

These local interactions limit the performance of this optimized δ-TiN layer as "hillock", "spike", and "notch" suppression layer.

The effect of substrate bias on grain boundaries condition of single phase face centered cubic by δ-TiN and on spike and β-phase silicon precipitation suppression efficiency has been discussed above. The application of a small bias during reactive sputtering results in a very dense and closely packed δ-TiN grain structure through which aluminum, silicon or titanium could not freely diffuse. This dense structure is easy to obtain on a horizontal surface because argon and nitrogen ion bombardment, induced by the application of the small negative bias, is normal to the surface and effective. TiN film density is uniform and maximum on these horizontal surfaces.

Vertical surfaces or surfaces with small solid angle openings toward sputtering area see minimal ion bombardment or very ineffective bombardment angle of incidence. Since TiN grains orient their axis parallel to the ion bombardment direction, and since ion bombardment tends to be normal to the microscopic surface, grain structure and orientation is not uniform on topography and this, coupled with sputtering pressure and titanium target line of sight effects, cause the formation of diverging grains at the upper corners of contact and via holes as well as at converging ones at their bottom corners.

Such grain orientation dependencies were computer simulated for sputtering and show that these diverging or converging grains reduce local density at the bottom corners of contact and via holes. Reactively sputtered TiN, because of its reduced mobility and relatively low sputtering temperature, also results in the formation of such oriented grains which reduce TiN density at bottom corners of contact and via holes.

FIGS. 10a and 10b show a computer simulation of the grain orientation versus position dependency and its effect on local density. Position and topography dependant grain structure and composition also has a local effect on reflectivity, intrinsic stress, and resistivity.

As discussed above, the bulk and interface properties of δ-TiN are extremely dependant on its grain structure and stoichiometry; the stoichiometric face centered cubic single phase with closely packed grains obtained by reactive bias sputtering (or reactive ion plating) being preferred.

Composition, grain structure and crystallography of TiN, as observed by Scanning Transmission Electron Microscopy, STEM, Microscopic X-Ray, Diffraction, MRXD, Electron Energy Loss Spectroscopy, ELLS, and Microscopic Energy Dispersive X-Rays, MEDX, are dependant upon local topography; reactively sputtered TiN deposited on interval vertical walls of contacts and vias have a different composition, grain structure and crystallography than equivalent TiN deposited on horizontal surfaces.

The effect of topography on stability of aluminum alloy and TiN as well as polysilicon and TiN interfaces was verified by exposing the two structures shown in FIG. 11 to three (3) 30 min. heat treatments at 450° C. and one (1) 30 min. at 480° C.

These EDX spectra of as-deposited as well as heat treated vertically oriented aluminum alloy films show the presence of titanium and silicon in the aluminum alloy while equivalent spectra taken on horizontal area of as-deposited as well as heat treated patterned structures show no such presence. This indicated dissolution of titanium from TiN as well as silicon from underlying polysilicon in the aluminum alloy in the vertical zones of the structures and this, even for as-deposited films.

For both test structures, the aluminum alloy was sputtered immediately after the reactive sputtering of TiN deposition without breaking the vacuum between depositions. Observations of both test structures before and after heat treatment show important degradation of as-deposited as well as heat treated vertical interfaces on patterned structures while as-deposited un-patterned structures, heat treated unpatterned structures, as well as horizontal interfaces of heat treated patterned structures show no equivalent degradation of any interface in any orientation (degraded interfaces are drawn as double lines in the previous figure). The composition of Al,TiN as well as polysilicon films in the vertical regions of patterned wafers was measured before and after heat treatment. The results are shown in FIG. 11.

These EDX spectra also show the presence of aluminum in the destroyed TiN vertical film and aluminum as well as titanium in the dissolved polysilicon. These TiN films deposited on vertical regions of ICs are not good diffusion barriers.

The reason for TiN diffusion barrier failure on the side walls of the patterned test structures comes from its local composition and grain structure.

The vertical zones of TiN are not single phase face centered cubic and stoichiometric δ-TiN but also contain relatively free titanium from, in that particular case, the titanium rich tetragonal phase, ε-$Ti_2N$, as verified by MRXD and EELS. Titanium, from this titanium rich ε-Ti₂N phase, can diffuse and dissolve in the aluminum alloy to satisfy its solubility limit and cause the barrier to locally fail, and the titanium intermetallics, TiAl₃ to precipitate upon cooling.

The appearance of this local tetragonal phase ε-Ti₂N is caused by a local reduction of the nitrogen flux during reactive sputtering because of topography induced local reduction of the nitrogen incident solid angle.

Other observations of the same phenomenon used Auger Electron Spectroscopy, AES, and more precisely the 385- to-420 eV intensity ratio, which is known to be proportional to the nitrogen-to-titanium atomic ratio, to compare TiN stoichiometry on contact hole wall, on contact hole bottom surface, and on corresponding planar surface of the same wafer.

This analysis indicates that the titanium nitride contains about 44.5 at. % N at contact hole wall, about 50.7 at. % N at contact hole bottom, and about 49.0 at. % N at corresponding planar surface of the same wafer.

Since the nitrogen content of the TiN deposited on contact hole walls is higher than the critical value of about 38.0 at. % N., the δ-phase face centered cubic titanium nitride is the only phase present and the formation of the tetragonal phase ε-Ti₂N is prevented in that case.

Step coverage of TiN is minimal at the bottom corners of contact and via holes. A three-dimensional simulation of a sputtered TiN layer over a 1.0 μm diameter contact hole and Scanning Electron Microscope photographs of the real situation are presented in FIG. 13. The arrow indicates the failure point of the barrier due to spiking.

The arrow of the previous figure shows a region where the TiN coverage is minimal. This TiN region also has a minimal density due to a local TiN grain orientation gradient, as predicted by the computer simulation. It also has a titanium rich stoichiometry, and is known to be the preferred site for the destruction of TiN barrier properties.

A possible preventive technique could use sputtered metallic titanium, the local reaction of titanium with silicon at the bottom of contact holes to monosilicon and polysilicon to form titanium monosilicide, TiSi, preferential etching of unreacted metallic titanium, the transformation of the selectively formed titanium monosilicide to a thin layer of titanium nitride by thermal growth in ammonia at temperatures of about 950° C. for about 45 minutes, to prevent the formation of this low density and small coverage region and to use the locally formed silicon nitride to try to improve the barrier properties. Such a technique, however, would fail because it could not grow more than about 20 nm of TiN from TiSi and the obtained TiN is of very poor quality.

In summary, TiN barrier property degradation is believed to occur at that precise region according to the following mechanism:

1) Titanium is well bonded to nitrogen in region of optimize single phase face centered cubic δ-TiN characterized by a high density material with closely packed grains and small inter-grain volume. It cannot diffuse on grain boundaries in these optimized regions. Titanium present on grain boundaries of non-optimized TiN, and particularly at this local titanium rich TiN region characterized by a low density and a large inter-grain volume, is relatively poorly bonded and, at relatively low temperatures can break its surface bonds and diffuse on the grain boundaries up to the TiN-aluminum alloy interface.

2) Titanium dissolves in the aluminum alloy, and, upon cooling, precipitates at aluminum alloy grain boundaries as aluminum rich intermetallic precipitates TiAl₃:

Ti+3 Al=TiAl₃ (T≧325° C.)

This titanium consumption by the aluminum alloy leaves large open regions in the TiN due to an increase of the inter-grain volume (inter-grain spacings as large as 3.0 nm were seen throughout the thickness of un-biased δ-TiN films).

3) This relatively free titanium also reaches the silicon/TiN interface and forms an Al$_x$Ti$_y$Si$_z$ ternary compound, e.g. Ti₇Al₅Si₁₂ or other decomposition compound.

4) Silicon, from monosilicon or polysilicon, can now diffuse in the open regions of TiN up to the TiN-aluminum alloy interface and enter in solid solution in the aluminum alloy.

5) Aluminum can now diffuse through the open structure of TiN left by titanium movement, and contributes to the formation of the small ternary compound at the TiN/silicon interface, and/or grows locally as a large single crystal aluminum spike when no more titanium is available to form this compound. As discussed in above, such a penetration, by aluminum of optimized high density and small inter-grain volume δ-TiN is normally only possible at temperatures higher than about 550° C. because of a very low coefficient of diffusion of aluminum in δ-TiN at lower temperatures and because TiN chemical attack by the aluminum alloy has a Gibbs free energy that becomes negative only at such high temperatures:

4 Al+δ-TiN=δ-AlN+TiAl₃ (T≧550°–600° C.)

The local reduced density of TiN in this region, coupled with its reduced thickness and the open structure left by titanium movement, is believed to be the cause of such lower temperature penetration of aluminum in TiN.

This mechanism is also supported by the fact that oxygen stuffing occurring at the grain boundaries of porous TiN reduces penetration in the aluminum by relatively free titanium and improves its barrier properties at temperatures near 550° C. Oxygen stuffing of TiN is believed to stabilize the titanium which is poorly bonded in the low density region by locally forming more stable titanium oxides and titanium oxynitrides. This local titanium blocking prevents titanium movement and dissolution in aluminum alloys and improves TiN barrier properties at temperatures up to 550° C.

By using for the interconnect layer an aluminum alloy containing titanium, which has a content of titanium of at least the limit of solid solubility of titanium, in this aluminum alloy, at the highest temperature that the TiN-aluminum alloy interface will see during manufacturing of the device the TiN-aluminum, the stabilization of the TiN-aluminum alloy can be achieved.

The use of such titanium pre-saturated aluminum alloy prevents relatively free titanium from leaving low quality regions of TiN, from penetrating and dissolving in aluminum at temperatures as low as 325° C. and from precipitating upon cooling at aluminum alloy grain boundaries, as an aluminum rich intermetallic phase, TiAl₃.

This limit of solid solubility can be estimated by looking at various aluminum-titanium phase diagrams shown in FIGS. 14a to 14g.

Table 4 summarizes published wt % Ti solubility limits at the eutectic temperature of 665.1° C., at the peritectic temperature of 660.4° C., at the TiN barrier limit temperature of 550° C., which is the highest temperature that TiN can see before aluminum penetration and attack, and at the metallization limit temperature of 500° C. which is the highest temperature that the semiconductor device will see during and/or after aluminum metallization.

TABLE 4

| Sample No. | 665.1° C. | 660.4° C. | 550° C. | 500° C. |
|---|---|---|---|---|
| 1 | 0.15 | >1.00 | ? | ? |
| 2 | 0.19 | 0.28 | <0.20 | <0.20 |
| 3 | 0.05 | 0.29 | 0.16 | 0.14 |
| 4 | 0.15 | 1.20 | ? | ? |
| 5 | 0.15 | 1.18 | 0.37 | 0.20 |
| 6 | 0.15 | 0.32 | ? | ? |
| 7 | 0.15 | 1.08 | 0.40 | 0.22 |
| 8 | 0.15 | 1.08 | 0.40 | 0.22 |
| 9 | 0.16 | ? | ? | ? |
| 10 | 0.15 | 1.00 | ? | ? |
| 11 | ? | 1.25 | ? | ? |

This table shows that up to 0.19 wt % Ti can enter in solution in the aluminum alloy melt at the eutectic temperature of 665.1° C.; that titanium supersaturated aluminum alloy solid solution containing up to about 1.25 wt % Ti can be obtained at the peritectic temperature of 660.4° C.; and that up to about 0.40 wt % Ti can dissolve at 550° C. and that up to about 0.22 wt % Ti can enter solid solution at 500° C.

The bulk resistivity of pure aluminum is 2.65 μΩ.cm at room temperature. The bulk resistivity of aluminum-titanium alloys increases at a rate of 2.88 μΩ.cm per wt % Ti in solid solution and at a rate of 0.12 μΩ.cm per wt % Ti out of solution. It is then necessary to keep the titanium content of the aluminum alloy at a minimum to ensure the lowest possible bulk resistivity.

The most common aluminum alloy that is used as interconnect material of devices without a barrier layer contains (98.5 wt % Al)—(1.00 wt % Si)—(0.50 wt % Cu) and has a theoretical bulk resistivity as high as 3.84 μΩ.cm when all the silicon and copper is dissolved in aluminum. This represents 1.24 times the bulk resistivity of pure aluminum.

The aluminum alloy containing about 0.40 wt % Ti, which is needed to stabilize the (poor quality TiN)/(aluminum alloy) interface to a temperature of up to 550° C., has a theoretical bulk resistivity that can be as high as 3.80 μΩ.cm when all the titanium is dissolved in aluminum. This represents 1.43 times the bulk resistivity of pure aluminum In accordance with the invention, aluminum alloys used as the interconnect layer contain titanium in contact with TiN layers in devices exposed to temperatures lower than 550° C. and preferably in the 450°–500° C. range. The titanium content may be as large as the limit of solid solubility at the peritectic temperature of 660.4° C., which is 1.25 wt %, but is preferably lower than 0.40 wt % and can be as small as 0.05 wt %.

The titanium containing aluminum alloy can be deposited as a sputtered film. It is also possible to deposit this alloy by co-evaporation of aluminum and titanium, by low pressure chemical vapour deposition, LPCVD, by metalorganic chemical vapour deposition, MOCVD, by plasma enhanced chemical vapour deposition, PECVD, by electron cyclotron resonance deposition, ECR, or by ionized cluster beam deposition, ICB.

The titanium nitride can be deposited as a reactively sputtered film or by reactive evaporation, by low pressure chemical vapour deposition, LPCVD, by metal organic chemical vapour deposition, MOCVD, by plasma enhanced chemical vapour deposition, PECVD, by electron cyclotron resonance deposition, ECR, or by ionized cluster beam deposition, RICB.

The titanium nitride can be an optimized stoichiometric single phase face centered cubic δ-TiN, but can also be a non-optimized or non stoichiometric single phase face centered cubic δ-TiN, tetragonal ε-Ti$_2$N or a solid solution of the above.

The aluminum alloy film can be sputtered in the same system that is used to reactively sputter the TiN film. In this case, air exposure is prevented and the (aluminum alloy)/TiN interface is free from oxygen. This is possible in multiple targets and single sputtering chamber system, equipped or not with load-locks or in multiple chambers sputtering system such as cluster tool. The same benefits are possible for air exposed (aluminum alloy)/TiN interfaces which become oxidized.

FIG. 15 shows a structure in accordance with the invention. In FIG. 15, a TiN barrier layer 8 is deposited on the Aluminum interconnect layer 4 so as to prevent the formation of spikes into the overlying dielectric layer 5. In accordance with the invention, the interconnect layer 4 is an aluminum alloy having a concentration of Ti at least equal to the limit of solid solubility of Ti in Al at the temperature at which post treatment processing of the device occurs.

The invention has been described with reference to CMOS devices but it is also applicable to bipolar devices or Bi-CMOS devices, to gallium arsenide, GaAs, devices, and to any other compound semiconductor devices.

While double level aluminum alloy interconnect devices have been described the invention is also applicable to multi-level interconnect devices that use tungsten in one or many interconnect levels, as well as single-level interconnect devices.

The invention also applies to discrete devices such as diodes, detectors, solar cells, light emitters, or power transistors.

While the invention can lead to improvements in yield and reliability improvement due to hillock, notch and spike reduction or elimination, similar improvements can result from improvements in electromigration and stress migration effects.

Although as (aluminum alloy)/TiN interface has been described, the invention is applicable to (gold alloy)/TiN interfaces, (tungsten alloy)/TiN interfaces, or (gold alloy)/TiN interfaces, which respectively use titanium containing gold, tungsten, or copper alloys to prevent dissolution of the TiN's titanium in the gold, tungsten, or copper alloy conductors.

The (aluminum alloy)/TiN interface described is primarily used in the manufacture of semiconductor devices, but it can also be applied to anti-reflective, anti-corrosion and anti-abrasive coating applications.

I claim:

1. A method of making a semiconductor device comprising the steps of:

a) depositing a first interconnect layer of a first metal on a substrate;

b) forming a barrier layer having an upper surface on said first interconnect layer to prevent hillock formation during subsequent processing at an elevated temperature of at least 350° C., said barrier layer comprising a compound of a second metal;

c) depositing a dielectric layer directly onto said upper surface of said barrier layer; and d) subsequently subjecting said device to said elevated temperature of at least 350° C. for subsequent processing;

wherein said first interconnect layer is an alloy presaturated with said second metal in amount at least equal to the limit of solid solubility of the second metal in said first metal at said particular elevated temperature at which said subsequent processing takes place.

2. A method as claimed in claim 1, wherein said compound of said second metal is titanium nitride and said second metal is titanium.

3. A method as claimed in claim 1, wherein said first metal is selected from the group consisting of: aluminum, gold, tungsten and copper.

4. A method as claimed in claim 2, wherein the titanium nitride in said barrier layer is a stoichiometric single-phase, face-centered δ-TiN.

5. A method as claimed in claim 2, wherein the titanium nitride in the barrier layer is non-stoichiometric single phase face-centered cubic δ-TiN.

6. A method as claimed in claim 2, wherein the titanium nitride in said barrier layer is tetragonal ε-Ti$_2$N.

7. A method as claimed in claim 2, wherein the titanium nitride in the barrier layer is a solid solution of two or more of the compounds selected from the group consisting of: stoichiometric single phase, face-centered cubic δ-TiN; non stoichiometric single phase face-centered δ-TiN; and tetragonal ε-Ti$_2$N.

8. A method as claimed in claim 2, wherein said first metal is aluminum, and said first interconnect layer contains titanium in an amount between 0.05 wt % and the limit of solid solubility at the peritectic temperature of said first metal.

9. A method as claimed in claim 8, wherein the amount of titanium in the first interconnect layer is the limit of solid solubility at the peritectic temperature.

10. A method as claimed in claim 8, wherein the titanium nitride in the barrier layer is a solid solution of two or more compounds selected from the group consisting of: stoichiometric single phase, face-centered cubic δ-TiN, non-stoichiometric single phase face-centered δ-TiN, and tetragonal ε-Ti$_2$N.

11. A method of making a semiconductor device comprising the steps of:

a) depositing an aluminum alloy interconnect layer on a substrate;

b) forming a TiN barrier layer having an upper surface on said aluminum layer to prevent hillock formation during subsequent processing at an elevated temperature of at least 350° C.;

c) depositing a dielectric layer directly onto said upper surface of said TiN barrier layer;

d) subsequently subjecting said device to said elevated temperature of at least 350° C. for subsequent processing; and said aluminum alloy interconnect layer being presaturated with titanium in amount at least equal to the limit of solid solubility of titanium in aluminum at said particular elevated temperature at which said subsequent processing takes place.

12. A method as claimed in claim 11 wherein said post treatment temperature is above 450° C. and lower than 550° C.

\* \* \* \* \*